US012635315B2

(12) United States Patent
Kim et al.

(10) Patent No.: US 12,635,315 B2
(45) Date of Patent: May 19, 2026

(54) NANOSTRUCTURES, PRODUCTION METHOD THEREOF, ELECTRONIC DEVICE INCLUDING THE SAME

(71) Applicant: Samsung Electronics Co., Ltd., Suwon-si (KR)

(72) Inventors: Seon-Yeong Kim, Suwon-si (KR); Yong Wook Kim, Yongin-si (KR); Soo Kyung Kwon, Suwon-si (KR); Ji-Yeong Kim, Suwon-si (KR); Sungwoo Hwang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 980 days.

(21) Appl. No.: 17/846,143

(22) Filed: Jun. 22, 2022

(65) Prior Publication Data

US 2022/0406974 A1      Dec. 22, 2022

(30) Foreign Application Priority Data

Jun. 22, 2021      (KR) ........................ 10-2021-0081006

(51) Int. Cl.
| | |
|---|---|
| *H10H 20/851* | (2025.01) |
| *B82Y 20/00* | (2011.01) |
| *B82Y 40/00* | (2011.01) |
| *C09K 11/88* | (2006.01) |
| *H10H 20/812* | (2025.01) |
| *H10H 20/823* | (2025.01) |

(52) U.S. Cl.
CPC ....... *H10H 20/8512* (2025.01); *C09K 11/883* (2013.01); *H10H 20/812* (2025.01); *H10H 20/823* (2025.01); *B82Y 20/00* (2013.01); *B82Y 40/00* (2013.01); *C01P 2004/64* (2013.01); *C01P 2004/80* (2013.01)

(58) Field of Classification Search
CPC .............. H10H 20/812; H10H 20/823; H10H 20/8513; C09K 11/883; C01P 2004/64; C01P 2004/80
See application file for complete search history.

(56) References Cited

U.S. PATENT DOCUMENTS

| | | | |
|---|---|---|---|
| 10,619,096 B2 | 4/2020 | Park et al. | |
| 10,954,440 B2 | 3/2021 | Won et al. | |
| 2017/0052444 A1 | 2/2017 | Park et al. | |
| 2019/0119565 A1 | 4/2019 | Jeong et al. | |
| 2020/0224094 A1 | 7/2020 | Won et al. | |
| 2020/0248073 A1 | 8/2020 | Lee et al. | |
| 2020/0332191 A1* | 10/2020 | Kwon .................... | G02B 6/005 |
| 2021/0207027 A1 | 7/2021 | Won et al. | |

FOREIGN PATENT DOCUMENTS

| | | |
|---|---|---|
| KR | 101971666 B1 | 4/2019 |
| KR | 101971586 B1 | 6/2019 |
| KR | 20190106823 A | 9/2019 |
| KR | 20200087715 A | 7/2020 |
| KR | 20200122719 A | 10/2020 |
| WO | 2020063256 A | 4/2020 |

* cited by examiner

*Primary Examiner* — C Melissa Koslow
(74) *Attorney, Agent, or Firm* — CANTOR COLBURN LLP

(57) ABSTRACT

Nanostructures including a first semiconductor nanocrystal including zinc and selenium, and a second semiconductor nanocrystal including a zinc chalcogenide, wherein a composition of the second semiconductor nanocrystal is different from a composition of the first semiconductor nanocrystal, wherein the nanostructures further include tellurium, wherein in the nanostructures, a mole ratio of selenium to tellurium is greater than or equal to about 0.83:1 and less than or equal to about 10:1, wherein a derivative thermogravimetry curve of the nanostructures has an extreme value in a temperature range of greater than or equal to about 250° C. and less than or equal to about 420° C.

20 Claims, 13 Drawing Sheets

Pattern Preparation by using a photoresist

Repeating the Patterning Process three times

NANOSTRUCTURES, PRODUCTION METHOD THEREOF, ELECTRONIC DEVICE INCLUDING THE SAME

CROSS-REFERENCE TO RELATED APPLICATION

This application claims priority to Korean Patent Application No. 10-2021-0081006, which was filed in the Korean Intellectual Property Office on Jun. 22, 2021, and all the benefits accruing therefrom under 35 U.S.C. § 119, the contents of which in its entirety is incorporated herein by reference.

BACKGROUND

1. Field

A nanostructure, a method of making the nanostructure, and an electronic device including the nanostructure are disclosed.

2. Description of the Related Art

A nanostructure such as a quantum dot may show, e.g., exhibit, different aspects, characteristics, or properties than a corresponding bulk material having substantially the same composition, for example, in terms of some of the physical properties of the nanostructure (e.g., a bandgap energy, a luminescent property, and the like), which are intrinsic in, e.g., to, the bulk material. A luminescent nanostructure(s) may be configured to emit light upon excitation by an energy such as an incident light or an applied voltage. In a light emitting device, quantum dots, which are luminescent nanostructures, may be positioned in a form of a quantum dot composite. The luminescent nanostructure may find applicability in a variety of devices (e.g., a display panel or an electronic device including the display panel).

SUMMARY

An embodiment provides a nanostructure(s) capable of exhibiting enhanced, e.g., improved, optical properties such as a narrow full width at half maximum, an increased luminous efficiency, or both.

An embodiment provides a method of producing the aforementioned nanostructure(s).

An embodiment provides a quantum dot composite including the aforementioned nanostructure(s).

An embodiment provides an electronic device, e.g., a display device, including the aforementioned nanostructure(s).

In an embodiment, nanostructure(s) (hereinafter, at times, also referred to as "nanostructure") includes (or include)

a first semiconductor nanocrystal including zinc and selenium, and a second semiconductor nanocrystal including a zinc chalcogenide, wherein a composition of the second semiconductor nanocrystal is different from a composition of the first semiconductor nanocrystal, wherein the nanostructure(s) further include tellurium, wherein in the nanostructure(s), a mole ratio of selenium to tellurium is greater than or equal to about 0.83:1 and less than or equal to about 10:1, wherein a derivative thermogravimetry curve of the nanostructure(s) has an, e.g., at least one (e.g., greater than or equal to about 2 and less than or equal to about 10, less than or equal to about 5, or less than or equal to about 3) extreme value(s) in a temperature range of greater than or equal to about 250° C. (or at least about 300° C.) and less than or equal to about 420° C. (or at least about 400° C.).

The nanostructures may not include cadmium.

The nanostructures may be configured to emit green light.

A center wavelength of the green light (or a peak luminescent wavelength of the nanostructures) may be greater than or equal to about 490 nanometers (nm), or greater than or equal to about 500 nm, and less than or equal to about 580 nm, or less than or equal to about 550 nm.

The maximum photoluminescent peak of the nanostructure may have a wavelength in a range defined by a minimum wavelength and a maximum wavelength. For example, in an embodiment, a maximum luminescent peak wavelength of the nanostructure is in a range of greater than about 450 nanometers and less than or equal to about 600 nanometers.

The nanostructure may have a quantum efficiency (e.g., a quantum yield) of greater than or equal to about 60%.

The nanostructure may have a quantum efficiency (e.g., a quantum yield) of less than or equal to about 100%, or less than or equal to about 99%.

A maximum luminescent peak of the nanostructures may have a full width at half maximum (FWHM) of less than or equal to about 40 nm.

The FWHM may be greater than or equal to about 5 nm.

The nanostructure may have a quantum efficiency of greater than or equal to about 60% and a FWHM of less than or equal to about 40 nm.

The core of the nanostructure may be a first semiconductor nanocrystal, and may include $ZnSe_{1-x}Te_x$ (wherein x is greater than or equal to about 0.2, greater than or equal to about 0.3, greater than or equal to about 0.4, greater than or equal to about 0.5, greater than or equal to about 0.6, greater than or equal to about 0.7 and less than about 1, less than or equal to about 0.95, less than or equal to about 0.9, less than or equal to about 0.85, less than or equal to about 0.8, less than or equal to about 0.75, or less than or equal to about 0.7).

The zinc chalcogenide may include a zinc selenide, a zinc sulfide, a zinc selenide sulfide, or a combination thereof.

A relative standard deviation of sizes (e.g., a size distribution) of the nanostructures may be less than or equal to about 10%, less than or equal to about 9%, less than or equal to about 8.5%, or less than or equal to about 8% of an average size of the nanostructures.

A relative standard deviation of the nanostructures may be greater than or equal to about 3%, greater than or equal to about 5%, or greater than or equal to about 7% of an average size of the nanostructures.

An average size of the nanostructures may be greater than or equal to about 4.5 nm, or greater than or equal to about 5 nm.

An average size of the nanostructures may be less than or equal to about 30 nm, less than or equal to about 25 nm, less than or equal to about 20 nm, less than or equal to about 10 nm, less than or equal to about 8 nm, or less than or equal to about 6.5 nm.

The nanostructures may include a total amount of organics of less than or equal to about 30 weight percent, or less than or equal to about 29 weight percent, for example, as determined by a thermogravimetric analysis. The nanostructures may include a total amount of organics of less than or equal to about 1 weight percent, greater than or equal to about 5 weight percent, or greater than or equal to about 10 weight percent, as determined by a thermogravimetric analysis.

A derivative thermogravimetry curve (e.g., plotting a derivative of a weight loss against temperature) of the nanostructures may have a first local maximum value and optionally a first local minimum value for example adjacent the first local maximum value in a temperature range of greater than or equal to about 250° C., or greater than or equal to about 260° C. and less than or equal to about 420° C., less than or equal to about 400° C., less than or equal to about 390° C., or less than or equal to about 380° C.

The first local minimum value appears at a temperature greater than a temperature of the first local maximum value.

A weight percentage of degraded materials until the first local minimum value may be greater than or equal to about 30 weight percent, based on a total weight of degraded materials, as determined by a thermogravimetric analysis of the nanostructures.

In a thermogravimetric analysis of the nanostructures, a temperature at 5% weight loss (temp. of 5% weight loss) may be less than or equal to about 390° C., less than or equal to about 360° C., or less than or equal to about 350° C.

In a thermogravimetric analysis of the nanostructures, a temperature at 5% weight loss (temp. of 5% weight loss) may be greater than or equal to about 200° C., greater than or equal to about 250° C., or greater than or equal to about 300° C.

In the nanostructures, a mole ratio of selenium to tellurium may be greater than or equal to about 2:1.

In the nanostructure, a mole ratio of selenium to tellurium may be less than or equal to about 4.2:1.

The zinc chalcogenide may further include sulfur.

In the nanostructures, a mole ratio of a total of sulfur and selenium to tellurium ((S+Se):Te) may be greater than or equal to about 2:1.

In the nanostructures, a mole ratio of a total of sulfur and selenium to tellurium may be less than or equal to about 10:1.

The nanostructures may not include an indium phosphide.

The nanostructure may include a first organic ligand including a compound represented by $R^1COOH$ (wherein $R^1$ is a substituted or unsubstituted C1 to C40 aliphatic hydrocarbon group) and a second organic ligand including a compound represented by $R^2NH_2$ (wherein $R^2$ is a substituted or unsubstituted C1 to C40 aliphatic hydrocarbon group).

The aliphatic hydrocarbon group may be an alkyl group, an alkenyl group, an alkynyl group, or a combination thereof.

In an embodiment, a method of manufacturing the nanostructures includes:

preparing an organic solution including a zinc precursor in an organic solvent;

optionally heating the organic solution;

adding the first semiconductor nanocrystal and a chalcogen precursor to the organic solution and conducting a reaction between the zinc precursor and the chalcogen precursor to form the second semiconductor nanocrystal on the first semiconductor nanocrystal to manufacture the nanostructures, wherein the method includes adding a compound represented by Chemical Formula 1 to a reaction system for forming the second semiconductor nanocrystal before a luminescent peak wavelength of light emitted from particles in the reaction system (e.g., with an excitation light having a wavelength of about 458 nm) reaches about 480 nm (e.g., during which the luminescent peak wavelength of light emitted from particles in the reaction system is less than about 480 nm):

$$R^2NH_2 \qquad \text{Chemical Formula 1}$$

wherein $R^2$ is a substituted or unsubstituted $C_{5-40}$ (or $C_{10-35}$), for example, aliphatic hydrocarbon group.

The organic solvent may include an amine solvent. The amine solvent may include an aliphatic or aromatic secondary amine, an aliphatic or aromatic tertiary amine, or a combination thereof.

The amine solvent may be different from the compound represented by Chemical Formula 1.

The compound may be added to the reaction system after addition of the first semiconductor nanocrystal and optionally before, at a same time, or after addition of the chalcogen precursor.

In an embodiment, a nanostructure composite includes a matrix (e.g., a polymer matrix); and a plurality of nanostructures dispersed in the matrix, wherein the plurality of nanostructures includes the aforementioned nanostructures.

The matrix may include polymer.

The matrix may include a cross-linked polymer, a binder (polymer or monomer) including a carboxylic acid group, or a combination thereof.

The cross-linked polymer may include a polymerization product of a photopolymerizable monomer including a carbon-carbon double bond, a polymerization product of the photopolymerizable monomer and a polythiol compound having at least two thiol groups (e.g., at a terminal end of the polythiol compound), or a combination thereof.

The nanostructure composite may further include a metal oxide fine particle (e.g., dispersed in the matrix).

In an embodiment, a display device includes a light emitting element (e.g., a photoluminescent element) and optionally a light source, wherein the light emitting element includes the nanostructures or a nanostructure-polymer composite that include the aforementioned nanostructures.

If present, the light source may be configured to provide the light emitting element with incident light.

The incident light may have a luminescence peak wavelength of about 440 nanometers (nm) to about 560 nm (or about 450 nm to about 460 nm).

The light emitting element may include a sheet of the quantum dot polymer composite.

The light emitting element may include a stacked structure including a substrate and a light emitting layer (e.g., a photoluminescent layer) disposed on the substrate. The light emitting layer may include a pattern of the nanostructure composite. The pattern may include a, e.g., at least one, two, or three, repeating sections configured to emit light at a predetermined wavelength.

The display device may be configured to have color reproducibility of greater than or equal to about 80% based upon a BT2020 standard.

In an embodiment, an electronic device may include a first electrode and a second electrode each having a surface opposite the other; and an active layer (or a light emitting layer) including the nanostructures, e.g., nanostructure disposed between the first and the second electrodes.

The electronic device may further include a charge auxiliary layer (e.g., a hole auxiliary layer) disposed between the first electrode and the active layer.

The electronic device may further include a charge auxiliary layer (e.g., an electron auxiliary layer) disposed between the second electrode and the active layer.

In an embodiment, the nanostructure substantially not including a toxic heavy metal such as cadmium, may emit light of a desired wavelength (e.g., green light or light having a wavelength of greater than about 470 nm) with enhanced optical properties such as an improved efficiency and a reduced FWHM.

In an embodiment, the nanostructures may emit green light with a relatively high, e.g., level of a, quantum yield and a relatively narrow FWHM and thus may be included as a different form in a light emitting device or a display device including the light emitting device, contributing a realization of a display device having a high color reproducibility, a high efficiency, a high brightness, or a combination thereof. In an embodiment, the nanostructure may be applied to, e.g., used in, a biolabeling (biosensor, bioimaging), a photodetector, a solar cell, a hybrid composite, or the like.

BRIEF DESCRIPTION OF THE DRAWINGS

The above and other advantages and features of this disclosure will become more apparent by describing in further detail exemplary embodiments thereof with reference to the accompanying drawings, in which:

FIG. 3A is a schematic cross-sectional view of a display device according to an embodiment.

FIG. 3B is a schematic cross-sectional view of a display device according to an embodiment.

DETAILED DESCRIPTION

Figure 1A:
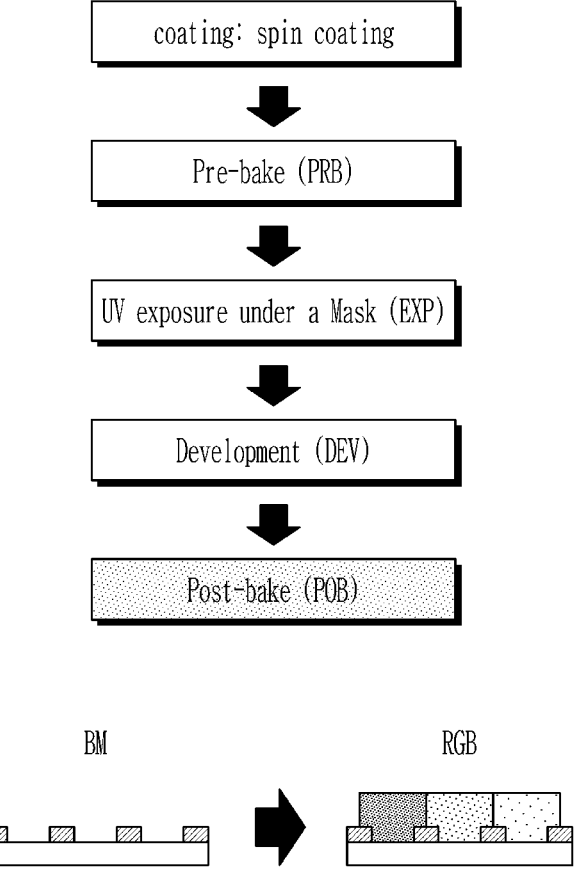
FIG. 1A schematically represents a process of producing a nanostructure composite pattern using a composition according to an embodiment.

Advantages and characteristics of this disclosure, and a method for achieving the same, will become evident referring to the following example embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art.

Unless otherwise defined, all terms used in the specification (including technical and scientific terms) may be used with meanings commonly understood by a person having ordinary knowledge in the art. It will be further understood that terms, such as those defined in commonly dictionary should be interpreted as having a meaning that is consistent with their meaning in the context of the relevant art, and may not be interpreted ideally or exaggeratedly unless clearly defined. The terminology used herein is for the purpose of describing particular embodiments only and is not intended to be limiting.

As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc., may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" may refer to replacement of hydrogen of a compound or a group by a substituent of a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—ON), an amino group (—NRR' wherein R and R' are independently hydrogen or a C1 to C6 alkyl group), an azido group (—N$_3$), an amidino group (—O(=NH)NH$_2$), a hydrazino group (—NHNH$_2$), a hydrazono group (=N(NH$_2$)), an aldehyde group (—O(=O)H), a carbamoyl group (—C(O)NH$_2$), a thiol group (—SH), an ester group (—O(=O)OR, wherein R is a 01 to C6 alkyl group or a C6 to C12 aryl group), a carboxyl group (—COOH) or a salt thereof (—O(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, a hydrocarbon group refers to a group including (or consisting of) carbon and hydrogen (e.g., an alkyl, alkenyl, alkynyl, or aryl group). The hydrocarbon group may be a group having a valence of one or greater formed by removal of a, e.g., at least one, hydrogen atom from alkane, alkene, alkyne, or arene. In the hydrocarbon group, a, e.g., at least one, methylene may be replaced by an oxide moiety, a carbonyl moiety, an ester moiety, —NH—, or a combination thereof.

As used herein, when a definition is not otherwise provided, "aliphatic" may refer to a saturated or unsaturated linear or branched hydrocarbon group. An aliphatic group may be an alkyl, alkenyl, or alkynyl group, for example.

As used herein, when a definition is not otherwise provided, "alkyl" refers to a linear or branched saturated monovalent hydrocarbon group (methyl, ethyl, hexyl, etc.).

As used herein, when a definition is not otherwise provided, "alkenyl" refers to a linear or branched monovalent hydrocarbon group having one or more carbon-carbon double bond.

As used herein, when a definition is not otherwise provided, "alkynyl" refers to a linear or branched monovalent hydrocarbon group having one or more carbon-carbon triple bond.

As used herein, when a definition is not otherwise provided, "aromatic" refers to an organic compound or group including a, e.g., at least one, unsaturated cyclic group having delocalized pi electrons. The term encompasses both hydrocarbon aromatic compounds and heteroaromatic compounds.

As used herein, when a definition is not otherwise provided, "aryl" refers to a group formed by removal of a, e.g., at least one, hydrogen from an aromatic hydrocarbon (e.g., a phenyl or naphthyl group).

As used herein, when a definition is not otherwise provided, "hetero" refers to including one or more (e.g., 1 to 3) heteroatom of N, O, S, Si, P, or a combination thereof.

As used herein, when a definition is not otherwise provided, "Group" refers to a group of Periodic Table.

As used herein, when a definition is not otherwise provided, "Group III" may refer to Group IIIA and Group IIIB, and examples of Group III metal may be In, Ga, and TI, but are not limited thereto.

As used herein, when a definition is not otherwise provided, "Group V" may refer to Group VA, and examples may include nitrogen, phosphorus, arsenic, antimony, and bismuth, but are not limited thereto.

As used herein, when a definition is not otherwise provided, the expression "not including cadmium (or other harmful heavy metal)" may refer to the case in which a concentration of each of cadmium (or another heavy metal deemed harmful) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other heavy metal) may be present or, if present, an amount of cadmium (or other heavy metal) may be less than or equal to a detection limit or as an impurity level of a given analysis tool (e.g., an inductively coupled plasma atomic emission spectroscopy).

As used herein, the upper and lower endpoints set forth for various values may be independently combined to provide a range.

In an embodiment, an amount of each of the components included in the nanostructure(s) as described herein may be determined through an appropriate analytical instrument and methods available to those of ordinary skill (e.g., an inductively coupled plasma atomic emission spectroscopy (ICP-AES), X-ray photoelectron spectroscopy (XPS), ion chromatography, Transmission electron microscopy energy-dispersive X-ray spectroscopy (TEM-EDS), or the like).

The term "average" as used herein (e.g., an average size of the nanostructure) may be a mean or a median. In an embodiment, the average may be a "mean" average.

As used herein, the quantum efficiency may be a relative quantum yield or an absolute quantum yield that can be readily measured by any suitable equipment. The quantum efficiency (or quantum yield) may be measured in a solution state or a solid state (as in a composite). In an embodiment, "quantum yield (or quantum efficiency)" may be a ratio of photons emitted to photons absorbed by the quantum dot composite, e.g., by a nanostructure or population of nanostructures. In an embodiment, the quantum efficiency may be determined by any suitable method. For example, quantum efficiency may be measured by an absolute method and a relative method. The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on the photoluminescent wavelengths, but are not limited thereto.

The quantum yield (QY) may be readily and reproducibly determined by using commercially available equipment, for example, from Hitachi Co. Ltd or Hamamatsu Co. Ltd and referring to the instruction manuals provided from the manufacturer.

The FWHM and the maximum PL peak wavelength may be determined by a photoluminescent spectrum obtained by a spectrophotometer (or Fluorescence Spectrophotometer).

Nanostructures such as semiconductor nanocrystal particles (e.g., a quantum dots) may absorb light from an excitation source and may emit light corresponding to a bandgap energy of the quantum dots. The bandgap energy of the nanostructure may vary with the size of the nanostructure, the composition of the nanostructure, or a combination thereof. For example, as the size of the quantum dot increases, the quantum dot may have a narrower, e.g., decreased, bandgap energy and may exhibit an increased light emitting wavelength. Some nanostructures may draw attention for potential use as a light emitting material in a variety of fields such as a display device, an energy device, or a bio light emitting device.

A nanostructure having a relatively increased photoluminescence property may include a toxic heavy metal such as cadmium (Cd), lead (Pb), mercury (Hg), or a combination thereof. A toxic heavy metal such as cadmium may pose somewhat serious concerns, for example, may pose an environmental issue, a health issue, or a combination thereof, and may be listed as a restricted element under Restriction of Hazardous Substances Directive (RoHS) in many countries. Accordingly, development of a nanostructure having improved photoluminescence characteristics is desired. A cadmium free indium phosphide quantum dot (QD) may be applied, e.g., in an actual device.

In order to be applied to, e.g., used in, a quantum dot display device (e.g., including a color conversion layer including the quantum dot) and to realize a display device having a relatively high color reproducibility under a next generation color standard such as BT2020, a nanostructure capable of showing, e.g., exhibiting, a luminescent peak with a relatively narrow full width at half maximum (FWHM) may be desired. For example, in order for a device to achieve an enhanced, e.g., improved, color reproducibility under the BT2020 standard, a luminous material used therein may be desired to have a reduced level of a, e.g., a smaller, FWHM.

A cadmium free nanostructure such as a zinc chalcogenide based (e.g., core-shell type) nanocrystal particle may be capable of showing, e.g., exhibiting, a reduced FWHM and an enhanced quantum yield at the same time. The present inventors have found that tellurium present in a nanostructure above, e.g., greater than, a predetermined amount may have a substantially adverse effect on a stability (for example, an oxidation stability) of the nanostructure, and thus as an amount of a zinc chalcogenide increases, it may become more difficult for the nanostructure to exhibit an increased luminous efficiency with maintaining a desired level, e.g., value, of a full width at half maximum at a desired luminescent wavelength.

A nanostructure of an embodiment may exhibit relatively improved optical properties (for example, an increased, e.g., level of, luminous efficiency and a reduced FWHM at a desired wavelength) by adopting features described herein even without toxic heavy metals such as cadmium, lead, mercury, or a combination thereof. In an embodiment, the nanostructures may emit light of a desired wavelength (e.g., a green light) with improved optical properties. The nanostructures of an embodiment having the features described herein may exhibit relatively uniform particle sizes (or shapes) for example with a uniform distribution.

In an embodiment, a nanostructure includes a first semiconductor nanocrystal including zinc and selenium, and a second semiconductor nanocrystal shell including a zinc chalcogenide, and the nanostructure(s) further includes tellurium. In the nanostructure(s), a mole ratio of selenium to tellurium may be greater than or equal to about 0.83:1. In the nanostructure(s), a mole ratio of selenium to tellurium may be less than or equal to about 10:1. A derivative thermogravimetry curve of the nanostructures exhibit a, e.g., at least one, for example, two, three, or more, extreme value(s) in a first temperature range of less than or equal to about 420° C. In the derivative thermogravimetry curve of the nanostructures, the number of the extreme values may be less than or equal to about 10, less than or equal to about 5, less than or equal to about 4, less than or equal to about 3, or less than or equal to about 2.

In an embodiment, the nanostructure(s) may have a core shell structure including a core and a shell disposed on (e.g., directly on) the core. The core may include the first semiconductor nanocrystal. The shell may include the second semiconductor nanocrystal. Tellurium may be included in the nanostructure (for example, in the first nanocrystal or in the core) for example in a predetermined amount.

In the nanostructure of an embodiment, the first semiconductor nanocrystal or the core may include $ZnSe_{1-x}Te_x$, wherein x is greater than about 0.1, greater than or equal to about 0.2, greater than or equal to about 0.3, greater than or equal to about 0.4, greater than or equal to about 0.5, greater than or equal to about 0.51, greater than or equal to about 0.52, greater than or equal to about 0.53, greater than or equal to about 0.54, greater than or equal to about 0.55, greater than or equal to about 0.56, greater than or equal to about 0.57, greater than or equal to about 0.58, greater than or equal to about 0.59, greater than or equal to about 0.6, greater than or equal to about 0.61, greater than or equal to about 0.62, greater than or equal to about 0.63, greater than or equal to about 0.64, greater than or equal to about 0.65, greater than or equal to about 0.66, greater than or equal to about 0.67, greater than or equal to about 0.68, greater than or equal to about 0.69, greater than or equal to about 0.70, greater than or equal to about 0.71, greater than or equal to about 0.72, greater than or equal to about 0.73, greater than or equal to about 0.74, or greater than or equal to about 0.75 and less than or equal to about 0.95, less than or equal to about 0.89, less than or equal to about 0.88, less than or equal to about 0.87, less than or equal to about 0.86, less than or equal to about 0.85, less than or equal to about 0.84, less than or equal to about 0.83, less than or equal to about 0.82, less than or equal to about 0.8, less than or equal to about 0.75, less than or equal to about 0.74, less than or equal to about 0.73, less than or equal to about 0.72, less than or equal to about 0.71, less than or equal to about 0.7, less than or equal to about 0.69, less than or equal to about 0.68, less than or equal to about 0.67, less than or equal to about 0.66, less than or equal to about 0.65, less than or equal to about 0.5, less than or equal to about 0.4, less than or equal to about 0.3, or less than or equal to about 0.2. In the core or the first semiconductor nanocrystal, an amount of tellurium may be greater than an amount of selenium.

In the nanostructure(s), a size (or an average size) of the core(s) may be greater than or equal to about 1 nm, greater than or equal to about 2 nm, greater than or equal to about 2.5 nm, greater than or equal to about 3 nm, greater than or equal to about 3.5 nm, greater than or equal to about 4 nm, or greater than or equal to about 4.5 nm. In the nano-structure(s), a size (or an average size) of the core(s) may be less than or equal to about 7 nm, less than or equal to about 6 nm, less than or equal to about 5 nm, less than or equal to about 4 nm, less than or equal to about 3.5 nm, less than or equal to about 3 nm, less than or equal to about 2.5 nm, or less than or equal to about 2 nm.

In an embodiment, the second semiconductor nanocrystal, the semiconductor nanocrystal shell, or the zinc chalcogenide included therein may include zinc; and a chalcogen element, i.e., sulfur, selenium, tellurium, or a combination thereof. In an embodiment, the second semiconductor nanocrystal, the semiconductor nanocrystal shell, or the zinc chalcogenide included therein may include ZnSe, ZnS, ZnSeS, ZnSeTe, ZnSTe, ZnSeSTe, or a combination thereof.

In the nanostructure, the semiconductor nanocrystal shell may be a multi-layered shell including a plurality of layers. In the plurality of layers of the shell, adjacent layers may include semiconductor nanocrystal material of different compositions. In an embodiment, the multi-layered shell may include a first shell layer including a third semiconductor nanocrystal including zinc and selenium and a second shell layer disposed on (e.g., directly on) the first shell layer and including a fourth semiconductor nanocrystal different from the third semiconductor nanocrystal. The first shell layer may include a second semiconductor nanocrystal. The second shell layer may be an outermost (shell) layer of the nanostructure or the semiconductor nanocrystal shell.

In an embodiment, the first shell layer or the third semiconductor nanocrystal may include zinc and selenium, and optionally sulfur. The first shell layer or the third semiconductor nanocrystal may include or may not include sulfur. The first shell layer or the third semiconductor nanocrystal may further include tellurium. The first shell layer or the third semiconductor nanocrystal may include ZnSe, ZnS, ZnSeS, ZnSeTe, ZnTeS, or a combination thereof.

In an embodiment, the second shell layer or the fourth semiconductor nanocrystal may include zinc and sulfur, and optionally selenium, tellurium, or a combination thereof. The second shell layer or the fourth semiconductor nanocrystal may include ZnS, ZnSeS, ZnSTeSe, ZnTeS, or a combination thereof.

A bandgap energy of the third semiconductor nanocrystal (or the first shell layer) may be greater than a bandgap energy of the core. A bandgap energy of the fourth semiconductor nanocrystal (or the second shell layer) may be greater than a bandgap energy of the third semiconductor nanocrystal (or the first shell layer). The fourth semiconductor nanocrystal (or the second shell layer) may be consist of a zinc sulfide. The fourth semiconductor nanocrystal (or the second shell layer) may include or may not include selenium, tellurium, or a combination thereof.

In an embodiment, the shell or each of the shell layers in the multi-layered shell may include a gradient alloy having a composition varying in a direction of a radius, e.g., a radial direction from the core toward an outermost surface of the nanostructure. In an embodiment, an amount of the sulfur in the semiconductor nanocrystal shell may increase toward a surface of the nanostructure. For example, in the shell, the amount of the sulfur may increase in a direction away from the core, e.g., in a radial direction from the core toward an outermost surface of the nanostructure.

A thickness of the second semiconductor nanocrystal or a thickness of the shell may be selected appropriately. In an embodiment, a thickness of the second semiconductor nanocrystal or a thickness of the shell (or in case of the multilayered shell, a thickness of a first shell layer, a second shell layer or a combination thereof) may be greater than or equal to about 0.1 nm, greater than or equal to about 0.2 nm, greater than or equal to about 0.3 nm, greater than or equal to about 0.4 nm, greater than or equal to about 0.5 nm, greater than or equal to about 0.7 nm, greater than or equal to about 0.9 nm, greater than or equal to about 1 nm, greater than or equal to about 1.2 nm, greater than or equal to about 1.4 nm, or greater than or equal to about 1.5 nm. In an embodiment, the thickness of the second semiconductor nanocrystal or the thickness of the shell may be less than or equal to about 2 nm, less than or equal to about 1.5 nm, less than or equal to about 1 nm, less than or equal to about 0.8 nm, or less than or equal to about 0.5 nm.

In an embodiment, a thickness of the second semiconductor nanocrystal or a thickness of the shell (or in case of the multilayered shell, a thickness of a first shell layer, a second shell layer or a combination thereof) may be greater than or equal to about 1 monolayer (ML), for example, greater than or equal to about 2 ML, greater than or equal to about 3 ML, greater than or equal to about 4 ML, greater than or equal to about 5 ML and less than or equal to about 10 ML, for example, less than or equal to about 9 ML, less than or equal to about 8 ML, less than or equal to about 7 ML, less than or equal to about 6 ML, or less than or equal to about 5 ML. The thickness of each shell layer in the multi-layered shell may be selected taking into consideration a desired composition of a final nanostructure.

In the nanostructure or the core of an embodiment, a mole ratio of tellurium to selenium (Te:Se) may be greater than or equal to about 0.1:1, greater than or equal to about 0.2:1, greater than or equal to about 0.25:1, greater than or equal to about 0.3:1, greater than or equal to about 0.35:1, greater than or equal to about 0.4:1, greater than or equal to about 0.45:1, greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, greater than or equal to about 0.85:1, greater than or equal to about 0.9:1, greater than or equal to about 0.93:1, greater than or equal to about 0.95:1, greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, greater than or equal to about 2.4:1, greater than or equal to about 2.5:1, greater than or equal to about 2.6:1, greater than or equal to about 2.7:1, greater than or equal to about 2.8:1, greater than or equal to about 2.9:1, or greater than or equal to about 3:1.

In the nanostructure or the core of an embodiment, a mole ratio of tellurium to selenium (Te:Se) may be less than or equal to about 4:1, less than or equal to about 3.9:1, less than or equal to about 3.8:1, less than or equal to about 3.7:1, less than or equal to about 3.6:1, less than or equal to about 3.5:1, less than or equal to about 3.4:1, less than or equal to about 3.3:1, less than or equal to about 3.2:1, less than or equal to about 3.1:1, less than or equal to about 3:1, less than or equal to about 2.9:1, less than or equal to about 2.8:1, less than or equal to about 2.7:1, less than or equal to about 2.6:1, less than or equal to about 2.5:1, less than or equal to about 2.4:1, less than or equal to about 2.3:1, less than or equal to about 2.2:1, less than or equal to about 2.1:1, less than or equal to about 2.0:1, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.2:1, less than or equal to about 1.1:1, less than or equal to about 1:1, less than or equal to about 0.9:1, less than or equal to about 0.8:1, less than or equal to about 0.7:1, less than or equal to about 0.6:1, less than or equal to about 0.5:1, or less than or equal to about 0.4:1.

In the nanostructure or the core (or the first semiconductor nanocrystal) of an embodiment, a mole ratio of selenium to tellurium (Se:Te) may be less than or equal to about 10:1, less than or equal to about 9:1, less than or equal to about 8:1, less than or equal to about 7:1, less than or equal to about 6.5:1, less than or equal to about 6:1, less than or equal to about 5.5:1, less than or equal to about 5:1, less than or equal to about 4.5:1, less than or equal to about 4:1, less than or equal to about 3.5:1, less than or equal to about 3:1, less than or equal to about 2.5:1, less than or equal to about 2:1, less than or equal to about 1.5:1, less than or equal to about 1:1, less than or equal to about 0.9:1, less than or equal to about 0.8:1, less than or equal to about 0.7:1, less than or equal to about 0.6:1, less than or equal to about 0.5:1, or less than or equal to about 0.45:1. In the nanostructure or the core (or the first semiconductor nanocrystal) of an embodiment, a mole ratio of selenium to tellurium (Se:Te) may be, greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.5:1, greater than or equal to about 0.55:1, greater than or equal to about 0.6:1, greater than or equal to about 0. 65:1, greater than or equal to about 0.7:1, greater than or equal to about 0.75:1, greater than or equal to about 0.8:1, greater than or equal to about 0.83:1, greater than or equal to about 0.85:1, greater than or equal to about 0.9:1, greater than or equal to about 0.95:1, greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.5:1, greater than or equal to about 2.8:1, greater than or equal to about 3:1, greater than or equal to about 3.5:1, greater than or equal to about 4:1, greater than or equal to about 4.5:1, greater than or equal to about 5:1, or greater than or equal to about 5.5:1.

In the nanostructure of an embodiment, a mole ratio of tellurium to zinc (Zn:Te) may be greater than or equal to about 0.5:1, greater than or equal to about 1:1, greater than or equal to about 1.5:1, greater than or equal to about 2:1, greater than or equal to about 2.1:1, greater than or equal to about 2.15:1, greater than or equal to about 2.2:1, greater than or equal to about 3:1, greater than or equal to about 3.5:1, greater than or equal to about 4:1, greater than or equal to about 4.5:1, greater than or equal to about 5:1, greater than or equal to about 5.5:1, greater than or equal to about 6:1, greater than or equal to about 6.5:1, greater than or equal to about 6.9:1, greater than or equal to about 7:1, greater than or equal to about 7.2:1, greater than or equal to about 7.5:1, or greater than or equal to about 8:1. In the nanostructure of an embodiment, a mole ratio of tellurium to zinc (Zn:Te) may be less than or equal to about 40:1, less than or equal to about 35:1, less than or equal to about 30:1, less than or equal to about 25:1, less than or equal to about 20:1, less than or equal to about 15:1, less than or equal to about 10:1, less than or equal to about 9:1, less than or equal to about 8.5:1, less than or equal to about 8:1, less than or equal to about 7.5:1, less than or equal to about 7:1, less than or equal to about 6.5:1, less than or equal to about 6:1, less than or equal to about 5.5:1, less than or equal to about 4.5:1, less than or equal to about 4:1, less than or equal to about 3.5:1, less than or equal to about 3:1, less than or equal to about 2.5:1, less than or equal to about 2.4:1, less than or equal to about 2.3:1, or less than or equal to about 2.25:1.

A nanostructure of an embodiment may further include sulfur. If present, a mole ratio of sulfur to zinc (S:Zn) may be greater than or equal to about 0.005:1, greater than or equal to about 0.01:1, greater than or equal to about 0.015:1, greater than or equal to about 0.02:1, greater than or equal to about 0.025:1, greater than or equal to about 0.03:1, greater than or equal to about 0.035:1, greater than or equal to about 0.04:1, greater than or equal to about 0.045:1, greater than or equal to about 0.05:1, greater than or equal to about 0.06:1, greater than or equal to about 0.07:1, greater than or equal to about 0.08:1, greater than or equal to about 0.09:1, greater than or equal to about 0.1:1, greater than or equal to about 0.15:1, greater than or equal to about 0.2:1, greater than or equal to about 0.25:1, greater than or equal to about 0.3:1, or greater than or equal to about 0.35 and less than or equal to about 0.95:1, less than or equal to about 0.9:1, less than or equal to about 0.85:1, less than or equal to about 0.8:1, less than or equal to about 0.75:1, less than or equal to about 0.7:1, less than or equal to about 0.65:1, less than or equal to about 0.6:1, less than or equal to about 0.5:1, less than or equal to about 0.4:1, or less than or equal to about 0.3:1.

In the nanostructure of an embodiment, a mole ratio of sulfur to tellurium (S:Te) may be greater than 0, greater than or equal to about 0.01:1, greater than or equal to about 0.05:1, greater than or equal to about 0.1:1, greater than or equal to about 0.2:1, greater than or equal to about 0.3:1, greater than or equal to about 0.4:1, greater than or equal to about 0.5:1, greater than or equal to about 0.6:1, greater than or equal to about 0.7:1, greater than or equal to about 0.8:1, or greater than or equal to about 0.9 and less than or equal to about 8:1, less than or equal to about 7:1, less than or equal to about 6:1, less than or equal to about 5:1, less than or equal to about 4.5:1, less than or equal to about 4:1, less than or equal to about 3.5:1, less than or equal to about 3:1, less than or equal to about 2.5:1, less than or equal to about 2:1, less than or equal to about 1.5:1, less than or equal to about 1:1, less than or equal to about 0.9:1, less than or equal to about 0.8:1, less than or equal to about 0.7:1, less than or equal to about 0.6:1, less than or equal to about 0.5:1, or less than or equal to about 0.4:1.

In the nanostructure of an embodiment, a mole ratio of a sum of sulfur and selenium to tellurium ((Se+S):Te) may be greater than or equal to about 1.5:1, greater than or equal to about 2:1, greater than or equal to about 2.5:1, greater than or equal to about 3:1, greater than or equal to about 3.5:1, greater than or equal to about 4:1, greater than or equal to about 4.5:1, greater than or equal to about 5:1, greater than or equal to about 5.5:1, greater than or equal to about 6:1, greater than or equal to about 7:1, greater than or equal to about 8:1, greater than or equal to about 9:1, or greater than or equal to about 10:1. In the nanostructure of an embodiment, a mole ratio of a sum of sulfur and selenium to tellurium ((Se+S):Te) may be less than or equal to about 20:1, less than or equal to about 16:1, less than or equal to about 15:1, less than or equal to about 14:1, less than or equal to about 13:1, less than or equal to about 12:1, less than or equal to about 11:1, less than or equal to about 10:1, less than or equal to about 9:1, less than or equal to about 8:1, less than or equal to about 7:1, less than or equal to about 6:1, less than or equal to about 5:1, less than or equal to about 4:1, less than or equal to about 3:1, or less than or equal to about 2:1.

In an embodiment, the nanostructure (e.g., the core, the shell, or a combination thereof) may not include manganese, copper, or a combination thereof. The nanostructure may not include a Group III-V compound. The Group III-V compound may include an indium phosphide, an indium zinc phosphide, a gallium phosphide, or a combination thereof. The nanostructure may not exhibit a peak assigned to the Group III-V compound (e.g., an indium phosphide or a gallium phosphide) in an X-ray diffraction analysis.

In an embodiment, providing the first semiconductor nanocrystal (or the core) with the second semiconductor nanocrystal or the shell may contribute to improving optical properties or stability (e.g., oxidation stability) of the nanostructure. An increased amount of the tellurium in the nanostructure may cause susceptibility to oxidation of the nanostructure and provision of an increased thickness of the second semiconductor nanocrystal may address this issue. The present inventors have found that as the first semiconductor nanocrystal or the core (for example having a relatively small size) is provided with the second semiconductor nanocrystal or the shell and a thickness of the second semiconductor nanocrystal (or the shell) is increased for a luminescent peak of intermediate particles to exceed a predetermined level, for example, about 480 nm, a full width at half maximum of a luminescent spectrum of a final nanostructure may be sharply increased.

Without wishing to be bound by any theory, it is believed that providing the first semiconductor nanocrystals (or the cores) having relatively small sizes with desired (e.g., increased) thicknesses of the second semiconductor nanocrystals (or the shells) may lead to a discontinuous or ununiform, e.g., non-uniform, shell growth. Without wishing to be bound by any theory, it is believed that in the discontinuous or ununiform, e.g., non-uniform, shell growth, some particles may have a far greater amount of coating than other particles, a coating uniformity between the particles may be sharply decreased. In addition, a shell growth in a single particle may be concentrated on some surface thereof, making a resulting particle have an irregular pod shape. Without wishing to be bound by any theory, it is also believed that as a coating uniformity between the particles decreases (e.g., as the differences among the coated amounts in the particles sharply increase), the resulting nanostructures may exhibit a sharply increased particle size distribution (e.g., an increased relative standard deviation) and a luminescent peak thereof may have a widened full width at half maximum, which may also bring, e.g., provide, a limited improvement of a luminous efficiency of the nanostructures.

Surprisingly, the present inventors have found that the nanostructures of an embodiment (that can be prepared in accordance with a method described herein and thus) may address such drawbacks.

In an embodiment, the nanostructures may include an organic substance (e.g., an organic ligand) for example bound to surfaces thereof, and a composition, an amount, or both of the organic substance may be controlled to exhibit a derivative thermogravimetry curve described herein.

In an embodiment, in a thermogravimetric analysis of the nanostructures, a derivative thermogravimetry curve may include a, e.g., at least one (e.g., two, three, or four), extreme values or extreme points in a first temperature range of less than or equal to about 420° C. The first temperature range may be less than or equal to about 415° C., less than or equal to about 410° C., less than or equal to about 400° C., less than or equal to about 390° C., less than or equal to about 380° C., less than or equal to about 370° C., less than or equal to about 365° C., or less than or equal to about 360° C. The first temperature range may be 200° C., greater than or equal to about 210° C., greater than or equal to about 230° C., greater than or equal to about 240° C., greater than or equal to about 245° C., greater than or equal to about 250° C., or greater than or equal to about 255° C.

The derivative thermogravimetry curve is a curve obtained by differentiating a thermogravimetric analysis (TGA) curve plotting a weight change of a material to be analyzed versus a temperature. The derivative thermogravimetry curve may be provided together with a TGA curve as basic results of a TGA analysis using any suitable TGA equipment. As used herein, the extreme value or extremum is the smallest (a local minimum point) or largest (a maximum point) value of a function, either being present in an arbitrarily small neighborhood of a point in the function's domain. Extrema can be found by taking the derivative of a function and setting the derivative of the function to equal zero, e.g., an extreme value may be located at a point, e.g., temperature, where the derivative of the function is equal to zero. A slope of a tangential line to a derivative thermogravimetry curve may be changed from a negative value to a positive value (or vice versa) around the extremum. For example, a slope of a tangential line to a derivative thermogravimetry curve may be changed from a positive value (+) to a negative value (−) around (i.e., before and after) a local maximum point, e.g., an extreme value, at which the slope is zero. A slope of a tangential line to a derivative thermogravimetry curve may be changed from a negative value to a positive value around a local minimum point, at which the slope is zero. The thermogravimetric analysis may provide information about a thermal degradation of a material to be analyzed depending on a temperature. The TGA for the nanostructure may provide information about organics (e.g., an organic ligand) included in the nanostructure.

In an embodiment, as determined by the thermogravimetric analysis, the nanostructures may exhibit a total amount of the organics that is less than or equal to about 30 wt %, less than or equal to about 29%, or less than or equal to about 28%, based on a total weight of the nanostructures. The total amount of the organics may be greater than or equal to about 10 wt %, greater than or equal to about 12 wt %, greater than or equal to about 15 wt %, or greater than or equal to about 20 wt %, based on a total weight of the nanostructures.

A temperature derivative thermogravimetry curve for the nanostructures may have a first local maximum value and optionally a local minimum value in the first temperature range. In an embodiment, the first local maximum value (if present the local minimum value, or a combination thereof)

may be present in a first temperature range of greater than or equal to about 200° C., greater than or equal to about 205° C., greater than or equal to about 210° C., greater than or equal to about 215° C., greater than or equal to about 220° C., greater than or equal to about 225° C., greater than or equal to about 230° C., greater than or equal to about 235° C., greater than or equal to about 240° C., greater than or equal to about 245° C., greater than or equal to about 250° C., greater than or equal to about 255° C., greater than or equal to about 260° C., greater than or equal to about 265° C., greater than or equal to about 270° C., greater than or equal to about 280° C., greater than or equal to about 290° C., greater than or equal to about 300° C., or greater than or equal to about 310° C., less than or equal to about 420° C., less than or equal to about 410° C., less than or equal to about 400° C., less than or equal to about 390° C., less than or equal to about 385° C., less than or equal to about 380° C., less than or equal to about 375° C., less than or equal to about 370° C., less than or equal to about 365° C., less than or equal to about 360° C., less than or equal to about 355° C., less than or equal to about 350° C., less than or equal to about 345° C., less than or equal to about 340° C., less than or equal to about 335° C., less than or equal to about 330° C., less than or equal to about 325° C., less than or equal to about 305° C., less than or equal to about 300° C., or less than or equal to about 295° C.; or a combination thereof. The first temperature range may be any range bounded by any two temperatures of the aforementioned limits.

A temperature of the local minimum value (i.e., a temperature at which the local minimum value is present) may be greater than a temperature of the local maximum value (i.e., a temperature at which the local maximum value is present). The local minimum value may be present adjacent to the first local maximum value in the first temperature range. A difference between the temperature of the first local minimum value and the temperature of the first local maximum value may be greater than or equal to about 15° C., greater than or equal to about 20° C., greater than or equal to about 25° C., greater than or equal to about 30° C., greater than or equal to about 40° C., or greater than or equal to about 45° C.; less than or equal to about 100° C., less than or equal to about 90° C., less than or equal to about 80° C., less than or equal to about 70° C., or less than or equal to about 65° C.; or a combination thereof. The first local minimum value may appear at the highest temperature in the first temperature range.

A weight percentage (wt %) of degraded materials until the first local minimum value may be greater than or equal to about 30 wt %, greater than or equal to about 31%, greater than or equal to about 32 wt %, greater than or equal to about 33 wt %, greater than or equal to about 34 wt %, or greater than or equal to about 35 wt %, based on a total weight of degraded materials, as determined by a thermogravimetric analysis of the nanostructures. A weight percentage of degraded materials until the first local minimum value may be less than or equal to about 50 wt %, less than or equal to about 45 wt %, less than or equal to about 40 wt %, or less than or equal to about 35 wt %, based on a total weight of degraded materials, as determined by a thermogravimetric analysis of the nanostructures In a thermogravimetric analysis of the nanostructures, a temperature at 5% weight loss (Temp. 5%) may be less than or equal to about 390° C., less than or equal to about 370° C., less than or equal to about 365° C., less than or equal to about 360° C., less than or equal to about 355° C., less than or equal to about 350° C., less than or equal to about 345° C., less than or equal to about 340° C., less than or equal to about 335° C., less than or equal to about 330° C., or less than or equal to about 325° C. In a thermogravimetric analysis of the nanostructures, a temperature at 5% weight loss (Temp. 5%) may be greater than or equal to about 200° C., greater than or equal to about 250° C., greater than or equal to about 270° C., greater than or equal to about 290° C., greater than or equal to about 300° C., or greater than or equal to about 310° C.

The nanostructures may include a first organic ligand represented by RCOOH (wherein R is a substituted or unsubstituted, C1 to C40, C2 to C35, C3 to C30, C4 to C25, C5 to C24, C6 to C23, C7 to C22, C8 to C21, C9 to C20, or 010 to C19 aliphatic or aromatic hydrocarbon) and a second organic ligand represented by $RNH_2$ (wherein R is a substituted or unsubstituted, C1 to C40, C2 to C35, C3 to C30, C4 to C25, C5 to C24, C6 to C23, C7 to C22, C8 to C21, C9 to C20, or C10 to C19 aliphatic or aromatic hydrocarbon). The first organic ligand, the second organic ligand, or a combination thereof may be bound to surfaces of the nanostructures. The first organic ligand may be an aliphatic (mono) carboxylic acid compound. The second organic ligand may be an aliphatic primary amine compound. In an embodiment, the extreme value(s) within the first temperature range may reflect decomposition of the second organic ligand.

In the nanostructures, a mole ratio of the second organic ligand to the first organic ligand may be greater than or equal to about 0.05:1, greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.45:1, greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, greater than or equal to about 0.85:1, or greater than or equal to about 0.9:1. In the nanostructures, a mole ratio of the second organic ligand to the first organic ligand may be less than or equal to about 10:1, less than or equal to about 9:1, less than or equal to about 8:1, less than or equal to about 7:1, less than or equal to about 6:1, less than or equal to about 5:1, less than or equal to about 4:1, less than or equal to about 3:1, less than or equal to about 2:1, less than or equal to about 1:1, less than or equal to about 0.9:1, less than or equal to about 0.85:1, less than or equal to about 0.8:1, less than or equal to about 0.75:1, less than or equal to about 0.7:1, less than or equal to about 0.65:1, less than or equal to about 0.6:1, less than or equal to about 0.55:1, less than or equal to about 0.5:1, less than or equal to about 0.45:1, less than or equal to about 0.4:1, less than or equal to about 0.35:1, less than or equal to about 0.3:1, or less than or equal to about 0.25:1.

The second organic ligand may include methyl amine, ethyl amine, propyl amine, butyl amine, pentyl amine, hexyl amine, heptyl amine, octyl amine, nonyl amine, decyl amine, dodecyl amine, hexadecyl amine, oleyl amine, octadecyl amine, stearyl amine, or a combination thereof. The first organic ligand may include methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, stearic acid, or a combination thereof.

The nanostructures may further include an organic ligand such as $R_2NH$, $R_3N$, $RSH$, $RH_2PO$, $R_2HPO$, $R_3PO$, $RH_2P$, $R_2HP$, $R_3P$, $ROH$, $RCOOR'$, $RPO(OH)_2$, $RHPOOH$, $R_2POOH$, a polymeric organic ligand, or a combination thereof wherein R and R' are the same or different, and are independently a C1 to C40 (e.g., C3 to C30 or C6 to C24) substituted or unsubstituted aliphatic hydrocarbon group (alkyl, alkenyl, or alkynyl) group, a C6 to C40 substituted or unsubstituted aromatic hydrocarbon group, or a combination thereof.

The organic ligand may coordinate to, e.g., be bound to, the surfaces of the nanostructures, helping them to be dispersed in a solvent (e.g., to form a colloidal dispersion). Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methyl amine, ethyl amine, propyl amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methylphosphine (e.g., trimethylphosphine, methyldiphenylphosphine, etc.), a substituted or unsubstituted ethylphosphine (e.g., triethylphosphine, ethyldiphenylphosphine, etc.), a substituted or unsubstituted propylphosphine, a substituted or unsubstituted butylphosphine, a substituted or unsubstituted pentylphosphine, or a substituted or unsubstituted octylphosphine (e.g., trioctylphosphine (TOP)); a phosphine oxide such as a substituted or unsubstituted methylphosphine oxide (e.g., trimethylphosphine oxide, methyldiphenylphosphine oxide, etc.), a substituted or unsubstituted ethylphosphine oxide (e.g., triethylphosphine oxide, ethyldiphenylphosphine oxide, etc.), a substituted or unsubstituted propylphosphine oxide, a substituted or unsubstituted butylphosphine oxide, or a substituted or unsubstituted octylphosphine oxide (e.g., trioctylphosphine oxide (TOPO)); diphenylphosphine, diphenylphosphine oxide, triphenylphosphine, or triphenylphosphine oxide; a mono- or di(C5 to C20 alkyl) phosphinic acid such as a mono- or dihexylphosphinic acid, a mono- or dioctylphosphinic acid, a mono- or di(dodecyl) phosphinic acid, a mono- or di(tetradecyl)phosphinic acid, a mono- or di(hexadecyl)phosphinic acid, a mono- or di(octadecyl)phosphinic acid, or a combination thereof; a C5 to C20 alkylphosphinic acid, a C5 to C20 alkylphosphonic acid such as hexylphosphonic acid, octylphosphonic acid, dodecylphosphonic acid, tetradecylphosphonic acid, hexadecylphosphonic acid, octadecylphosphonic acid, or a combination thereof; and the like, but are not limited thereto. Two or more different organic ligand compounds may be used.

When dispersed in water, the nanostructure may show, e.g., have, an average particle size of greater than or equal to about 300 nm, greater than or equal to about 400 nm, greater than or equal to about 500 nm, or greater than or equal to about 900 nm, as determined by a dynamic light scattering (DLS) analysis. When dispersed in an organic solvent (such as toluene, octane, or the like), the nanostructure may be configured to form an organic solution having an average particle size of less than or equal to about 500 nm, less than or equal to about 400 nm, less than or equal to about 300 nm, less than or equal to about 200 nm, less than or equal to about 100 nm, or less than or equal to about 90 nm, as determined by a DLS analysis. Examples of the organic solvent will be described herein. The organic ligand may not include a multifunctional compound having a thiol moiety and a carboxylic acid moiety. The organic ligand may not include glutathione compound. The quantum dot may be water-insoluble.

In an embodiment, the nanostructures may have the derivative thermogravimetry curve recited herein and may exhibit a reduced, e.g., level of a, size distribution (e.g., a relative standard deviation), which are believed to contribute to showing, e.g., exhibiting, an improved luminous efficiency together with a reduced FWHM of the luminescent peak of the nanostructures. According to the method described herein, the nanostructures as prepared may exhibit an improved coating uniformity and a particle size distribution thereof may be uniform (e.g., a relative standard deviation of the particle sizes may be kept in, e.g., maintained at, a very low level) and a sharp increase in the FWHM may be effectively suppressed, whereby the final nanostructures may exhibit an improved luminous efficiency together with a narrow FWHM even when they have an increased shell thickness.

In an embodiment, a size (or an average size) of the nanostructure(s) may be greater than or equal to about 2 nm, greater than or equal to about 2.5 nm, greater than or equal to about 3 nm, greater than or equal to about 3.5 nm, greater than or equal to about 4 nm, greater than or equal to about 4.5 nm, greater than or equal to about 5 nm, greater than or equal to about 5.5 nm, greater than or equal to about 6 nm, greater than or equal to about 6.5 nm, greater than or equal to about 7 nm, greater than or equal to about 7.5 nm, greater than or equal to about 8 nm, greater than or equal to about 8.5 nm, greater than or equal to about 9 nm, greater than or equal to about 9.5 nm, or greater than or equal to about 10 nm. In an embodiment, a size (or an average size) of the nanostructure(s) may be less than or equal to about 50 nm, less than or equal to about 45 nm, less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, or less than or equal to about 10 nm, less than or equal to about 9 nm, less than or equal to about 8 nm, less than or equal to about 7 nm, less than or equal to about 6.5 nm, less than or equal to about 6 nm, less than or equal to about 5.5 nm, or less than or equal to about 5 nm. As used herein, the size of the quantum dot may refer to a diameter or an equivalent diameter obtained from a two-dimensional image of an electron microscopy analysis (e.g., under an assumption of a circle). As used herein, "a size" may refer to a size of a single quantum dot or a (e.g., a mean or a median) average of quantum dots or a plurality of nanostructures. A size of the quantum dot(s) may be determined by using a result (e.g., an image) of a (transmission) electron microscopy analysis and any suitable image analysis computer program (e.g., Image J).

In an embodiment, the nanostructures may exhibit improved uniformity in terms of the sizes of the nanostructures (and optionally the shapes of the nanostructures). A particle size distribution, e.g., a relative standard deviation, of the nanostructures may be less than or equal to about 10%, less than or equal to about 9%, less than or equal to about 8.5%, or less than or equal to about 8%. The size distribution, e.g., the relative standard deviation, may be greater than or equal to about 1%, greater than or equal to about 3%, greater than or equal to about 5%, or greater than or equal to about 6%. As used herein, the phrase "relative standard deviation" refers to a percentage value obtained by multiplying a standard deviation by 100 and dividing by the average.

In an embodiment, the nanostructures may exhibit an improved shape factors such as solidity, roundness, or both. In an embodiment, the nanostructures may exhibit an average roundness of greater than or equal to about 0.70, greater than or equal to about 0.71, greater than or equal to about 0.72, greater than or equal to about 0.73, greater than or equal to about 0.74, greater than or equal to about 0.75, greater than or equal to about 0.76, greater than or equal to about 0.77, greater than or equal to about 0.78, greater than or equal to about 0.79, greater than or equal to about 0.8, greater than or equal to about 0.81, greater than or equal to about 0.82, greater than or equal to about 0.83, greater than or equal to about 0.84, or greater than or equal to about 0.85. In an embodiment, the nanostructures may exhibit an average solidity of greater than or equal to about 0.7, greater than or equal to about 0.75, greater than or equal to about 0.8, greater than or equal to about 0.85, or greater than or equal to about 0.9. Without wishing to be bound by a particular theory, it is believed that the improved shape parameter of the nanostructure population of an embodiment may indicate succeeding a core passivation with uniform shell growth thereon.

As used herein, the term "solidity" refers to a ratio (B/A) of an area (B) of a two dimensional area of a quantum dot with respect to an area (A) of a convex hull.

In an embodiment, the term "roundness" may refer to a definition as provided in The ImageJ User Guide (v 1.46r) and may be defined as follows:

$$4 \times \{ [\text{Area}] / (\pi \times [\text{major axis}]^2) \}$$

The "Area" may be a two-dimensional image area of a given particle and the major axis may refers to a main axis of the best-fitted oval shape of a given image.

The solidity and the roundness for given nanostructure(s) may be obtained from results of an electron microscopy analysis (e.g., using a transmission or scanning electron microscopy) and measured with using Image J (open source program developed by NIH) and referring to an Image J user guide (v 1.46r, Revised edition, the entire contents of which is incorporated herein by reference) or with using any suitable image analyzing program.

The nanostructures of an embodiment may exhibit improved uniformity in the shape factor such as the solidity, the roundness, or both. A relative standard deviation of the shape factor (e.g., the solidity or the roundness) may be greater than or equal to about 10%, less than or equal to about 9%, less than or equal to about 8.5%, less than or equal to about 8%, less than or equal to about 7%, less than or equal to about 6%, less than or equal to about 5%, or less than or equal to about 4%.

The size distribution, e.g., the relative standard deviation, of the nanostructures may be greater than or equal to about 1%, greater than or equal to about 3%, greater than or equal to about 5%, or greater than or equal to about 6%.

The nanostructures may emit green light. A (maximum) peak luminescent wavelength of the nanostructures (or the green light) may be greater than or equal to about 480 nm, greater than or equal to about 485 nm, greater than or equal to about 490 nm, greater than or equal to about 495 nm, greater than or equal to about 500 nm, greater than or equal to about 505 nm, greater than or equal to about 510 nm, greater than or equal to about 515 nm, or greater than or equal to about 520 nm. A (maximum) peak luminescent wavelength of the nanostructures (or the green light) may be less than or equal to about 580 nm, less than or equal to about 570 nm, less than or equal to about 560 nm, less than or equal to about 550 nm, less than or equal to about 540 nm, or less than or equal to about 535 nm. The green light may have a maximum luminescent peak wavelength in the aforementioned range, e.g., from about 500 nm to about 560 nm (for example, greater than or equal to about 515 nm and less than or equal to about 535 nm).

In an embodiment, the nanostructures may exhibit an improved (photoluminescent) quantum efficiency (or quantum yield). The quantum efficiency or the quantum yield may be a ratio of the number of emitted photons to the number of absorbed photons by the nanostructures. The quantum efficiency or the quantum yield may be measured in a relative manner involving the comparison with well characterized standard sample with a known quantum yield. The quantum efficiency or the quantum yield (hereinafter, at times, simply referred to as "quantum efficiency") may be measured in an absolute manner using an equipment with an integration sphere. A measuring equipment for the quantum yield or the quantum efficiency is commercially available from various manufacturers (e.g., Hitachi Col. Ltd, or Hamamatsu Co. Ltd.).

In an embodiment, the nanostructures may exhibit a quantum efficiency of greater than or equal to about 60%, greater than or equal to about 65%, greater than or equal to about 70%, greater than or equal to about 75%, greater than or equal to about 80%, or greater than or equal to about 85%. In an embodiment, the nanostructures may exhibit a (photo- or electro-) luminescent peak with a full width at half maximum of less than or equal to about 45 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, less than or equal to about 27 nm, less than or equal to about 26 nm, or less than or equal to about 25 nm.

In an embodiment, the nanostructures may be prepared by a method which includes:

preparing an organic solution including a zinc precursor in an organic solvent;

optionally heating the organic solution;

adding the first semiconductor nanocrystal (or a core particle including the same, hereinafter, at times simply referred to as "first semiconductor nanocrystal") and a chalcogen precursor to the optionally heated organic solution and conducting a reaction between the zinc precursor and the chalcogen precursor to form the second semiconductor nanocrystal (or a shell including the same, hereinafter, at times, simply referred to as "the second semiconductor nanocrystal") on the first semiconductor nanocrystal, wherein the method includes adding a compound represented by Chemical Formula 1 to a reaction system for forming the second semiconductor nanocrystal before a luminescent peak wavelength of light emitted from particles in the reaction system (e.g., with an excitation light having a wavelength of about 458 nm) reaches about 480 nm (e.g., during which the luminescent peak wavelength of light emitted from particles in the reaction system is less than about 480 nm):

$$R^2NH_2 \qquad \text{Chemical Formula 1}$$

wherein $R^2$ is a substituted or unsubstituted $C_{5-40}$ (or $C_{10-35}$) aliphatic hydrocarbon group.

The organic solvent may include an amine solvent. The amine solvent may include an aliphatic or aromatic secondary amine, an aliphatic or aromatic tertiary amine, or a combination thereof.

The amine solvent may be different from the compound represented by Chemical Formula 1.

A temperature of the heating of the organic solution may be greater than or equal to about 120° C., greater than or equal to about 130° C., greater than or equal to about 140° C., greater than or equal to about 150° C., greater than or equal to about 160° C., greater than or equal to about 170° C., greater than or equal to about 180° C., greater than or equal to about 190° C., greater than or equal to about 200° C., greater than or equal to about 210° C., or greater than or equal to about or 220° C. A temperature of the heating of the organic solution for forming the second semiconductor nanocrystal may be less than or equal to about 300° C., less than or equal to about 280° C., less than or equal to about 250° C., less than or equal to about 230° C., less than or equal to about 220° C., less than or equal to about 200° C., less than or equal to about 190° C., or less than or equal to about 180° C.

The organic solvent may include a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctylphosphine, TOP) substituted with a, e.g., at least one (e.g., 1, 2, or 3), C6 to C22 alkyl group, a phosphine oxide (e.g., trioctylphosphine oxide, TOPO) substituted with a, e.g., at least one (e.g., 1, 2, or 3), C6 to C22 alkyl group, a C12 to C22 aromatic ether such as a phenyl ether or a benzyl ether, or a combination thereof. In an embodiment, the organic solvent may include an amine solvent, and the amine solvent may be different from the compound represented by Chemical Formula 1. The organic solvent may not include a phosphine solvent (e.g., a TOP solvent), a phosphine oxide solvent (e.g., a TOPO solvent), or a combination thereof.

The organic solution may further include the (aforementioned) first organic ligand (e.g., an aliphatic carboxylic acid compound).

In an embodiment, the compound represented by Chemical Formula 1 may be added to the reaction system for the formation of the second semiconductor nanocrystal after the addition of the first semiconductor nanocrystal, the chalcogen precursor, or both. In an embodiment, the compound represented by Chemical Formula 1 may be added to the reaction system for the formation of the second semiconductor nanocrystal after the addition of the first semiconductor nanocrystal and optionally prior to, at the same time, or after the addition of the chalcogen precursor. In an embodiment, the compound represented by Chemical Formula 1 (hereinafter, simply referred to as "amine compound") may not be present in the organic solution during the optional heating of the organic solution (e.g., a pretreatment of the zinc precursor).

In an embodiment, the amine compound may be added to the reaction system prior to or after the addition of the first semiconductor nanocrystal. In an embodiment, the amine compound may be added to the reaction system prior to or after the addition of the chalcogen precursor. In an embodiment, the amine compound may be added to the reaction system together with the first semiconductor nanocrystal. In an embodiment, the amine compound may be added to the reaction system together with the chalcogen precursor.

In an embodiment, an amount (or a concentration) of the amine compound may about 20 M (moles/liter (L)) to about 0.01 M, about 15 M to about 0.05 M, about 10 M to about 0.1 M, about 9 M to about 0.2 M, about 8 M to about 0.3 M, about 7 M to about 0.5 M, about 6 M to about 0.8 M, about 5 M to about 1 M, about 4 M to about 1.5 M, or about 3 M to about 2.5 M, or a range of a combination thereof, based on the reaction solvent.

The preparation of the first semiconductor nanocrystal may not be particularly limited. In an embodiment, the preparation of the first semiconductor nanocrystal may include:

preparing a zinc precursor organic solution including a zinc precursor and a first organic ligand in a first organic solvent; and while heating the zinc precursor organic solution at a first reaction temperature, adding a selenium precursor, a tellurium precursor, a hydride compound, and a, e.g., at least one, second organic ligand to conduct a reaction.

The first reaction temperature (e.g., for core formation) may be greater than or equal to about 150° C., greater than or equal to about 200° C., greater than or equal to about 250° C., greater than or equal to about 260° C., greater than or equal to about 270° C., greater than or equal to about 280° C., greater than or equal to about 290° C., or greater than or equal to about 300° C. The first reaction temperature may be greater than or equal to about 280° C. The first reaction temperature may be less than or equal to about 350° C., for example, less than or equal to about 340° C., less than or equal to about 330° C., less than or equal to about 320° C., or less than or equal to about 310° C. The reaction time for the formation of the first semiconductor nanocrystal may be selected appropriately taking into consideration the precursors for the formation of the first semiconductor nanocrystal, the reaction temperature, sizes of the first semiconductor nanocrystal, or the like.

The reaction temperature for the second semiconductor nanocrystal (e.g., shell) formation (for example, a temperature for a reaction between the zinc precursor and the chalcogen precursor) may be selected appropriately in any suitable range of greater than or equal to about 200° C., for example, greater than or equal to about 210° C., greater than or equal to about 220° C., greater than or equal to about 230° C., greater than or equal to about 240° C., greater than or equal to about 250° C., greater than or equal to about 260° C., greater than or equal to about 270° C., greater than or equal to about 280° C., greater than or equal to about 290° C., or greater than or equal to about 300° C. and less than or equal to about 340° C., for example, less than or equal to about 325° C., less than or equal to about 310° C., less than or equal to about 300° C., less than or equal to about 290° C., less than or equal to about 280° C., less than or equal to about 270° C., or less than or equal to about 260° C., or a range of a combination thereof. The reaction time for the second semiconductor nanocrystal formation may be selected appropriately in light of a desired composition of the second semiconductor nanocrystal, types of the precursors, a temperature for the formation of the second semiconductor nanocrystal, a desired thickness of the second semiconductor nanocrystal, or the like.

The synthesized first semiconductor nanocrystal(s) or the core(s) may be separated from the reaction system (e.g., prior to the shell synthesis) (for example by adding a non-solvent). Details for the non-solvent will be set forth herein in detail. Details for the composition of the nanostructure(s) and the first semiconductor nanocrystal or core and the second semiconductor nanocrystal or shell are the same as set forth herein.

In an embodiment, the tellurium precursor used during the core synthesis may include tellurium dispersed in a second organic solvent and a concentration of the tellurium in the tellurium precursor (solution) may be greater than about 0.1 moles per liter (M), for example, greater than or equal to about 0.5 M, greater than or equal to about 1 M, greater than or equal to about 1.5 M, greater than or equal to about 2 M, or greater than or equal to about 2.5 M. The concentration of the tellurium may be less than or equal to about 10 M, less than or equal to about 5 M, or less than or equal to about 4 M.

In an embodiment of the synthesis of the first semiconductor nanocrystal, the selenium precursor, the tellurium precursor, the metal hydride compound, and the second organic ligand may be mixed together prior to being added to the zinc precursor organic solution, at a temperature of less than about 80° C., for example, less than or equal to about 75° C., less than or equal to about 70° C., less than or equal to about 65° C., less than or equal to about 60° C., less than or equal to about 55° C., less than or equal to about 50° C., or less than or equal to about 45° C. to form a single stock solution.

The metal hydride compound may include lithium, aluminum, or a combination thereof. The metal hydride compound may include an aluminum hydride compound, a lithium hydride compound, or a combination thereof. The metal hydride compound may include an organic metal hydride compound (for example, having a, e.g., at least one, hydrocarbon group), an inorganic metal hydride compound, or a combination thereof. The metal hydride compound may include an alkyl lithium hydride (e.g., dialkyl lithium borohydride for example wherein each alkyl group may have from 1 to 6 carbon atoms), a lithium aluminum hydride compound, or a combination thereof.

An amount of the metal hydride is not particularly limited and may be selected appropriately. An amount of the metal hydride may be, per one mole of tellurium, greater than or equal to about 0.01 moles, greater than or equal to about 0.05 moles, greater than or equal to about 0.1 moles, greater than or equal to about 0.5 moles, or greater than or equal to about 1 mole. An amount of the metal hydride may be, per one mole of tellurium, less than or equal to about 10 moles, less than or equal to about 5 moles, or less than or equal to about 3 moles.

In the preparation of the core, a mole ratio of the tellurium to the selenium introduced into the reaction system (Te:Se) may be greater than about 0.25:1, greater than or equal to about 0.3:1, greater than or equal to about 0.4:1, greater than or equal to about 0.5:1, greater than or equal to about 0.7:1, greater than or equal to about 0.9:1, greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, or greater than or equal to about 2.5:1.

In the preparation of the core, a mole ratio of the tellurium to the selenium introduced into the reaction system (Te:Se) may be less than or equal to about 10:1, less than or equal to about 9:1, less than or equal to about 8:1, less than or equal to about 7:1, less than or equal to about 6:1, less than or equal to about 5:1, less than or equal to about 4:1, less than or equal to about 3:1, less than or equal to about 2:1, or less than or equal to about 1.5:1.

In the preparation of the first semiconductor nanocrystal, a mole ratio of the zinc to the tellurium introduced to a reaction system may be selected appropriately taking into consideration a desired composition, the precursor(s), or the like. In an embodiment, in the preparation of the first semiconductor nanocrystal, an amount of the zinc with respect to one mole of the tellurium introduced to a reaction system may be greater than or equal to about 1 mole, greater than or equal to about 2 moles, greater than or equal to about 3 moles, greater than or equal to about 4 moles, or greater than or equal to about 5 moles. In an embodiment, in the preparation of the first semiconductor nanocrystal, an amount of the zinc to one mole of the tellurium introduced to a reaction system may be, less than or equal to about 20 moles, less than or equal to about 15 moles, less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, or less than or equal to about 2 moles.

In an embodiment, the first semiconductor nanocrystal may exhibit a maximum luminescent peak in a wavelength range of less than or equal to about 480 nm in a photoluminescent spectrum. The (maximum) luminescent peak wavelength of the first semiconductor nanocrystal may be greater than or equal to about 400 nm, 410 nm, greater than or equal to about 420 nm, greater than or equal to about 430 nm, greater than or equal to about 440 nm, greater than or equal to about 450 nm, greater than or equal to about 455 nm, greater than or equal to about 460 nm, greater than or equal to about 465 nm, greater than or equal to about 475 nm, or a combination of the recited limits herein.

In an embodiment, in an ultraviolet-visible (UV-Vis) absorption spectrum, the first semiconductor nanocrystal may exhibit a UV-Vis absorption peak in a wavelength range of greater than or equal to about 400 nm and less than or equal to about 450 nm. In an embodiment, the first absorption peak wavelength of the first semiconductor nanocrystal may be less than or equal to about 480 nm and greater than or equal to about 400 nm, 410 nm, greater than or equal to about 420 nm, greater than or equal to about 430 nm, greater than or equal to about 440 nm, greater than or equal to about 450 nm, greater than or equal to about 455 nm, greater than or equal to about 460 nm, greater than or equal to about 465 nm, or greater than or equal to about 475 nm, or a combination of the recited limits herein.

In an embodiment, the organic solution may be heated under vacuum (or vacuum treated) in an organic solvent in the presence of the first organic ligand at a predetermined temperature (e.g., at a temperature of greater than or equal to about 100° C., for example, greater than or equal to about 120° C.), and then an atmosphere of a reaction system may be changed with an inert gas and then the solution may be heated again at a predetermined reaction temperature (hereinafter, a pre-treatment). The pretreatment may be carried out in the absence of the second ligand. Without wishing to be bound by any theory, the co-presence of the second ligand with the first ligand during the pre-treatment may result in formation of the amide compound, and thus the nanostructures prepared therefrom may not exhibit a (derivative) thermogravimetry curve described herein.

In an embodiment, during the time the organic solution (or the pre-treated organic solution) may be heated again to a reaction temperature for forming the second semiconductor nanocrystal, the first semiconductor nanocrystal and the chalcogen precursor may be added to the organic solution (or the pre-treated organic solution) to conduct a reaction therebetween, and the amine compound represented by Chemical Formula 1 (i.e., the first amine compound) is also added to the reaction system before a luminescent peak wavelength of light that the particles in the reaction system are configured to emit reaches about 480 nm (e.g., during when the luminescent peak wavelength of the light emitted by the particle with excitation of light, for example, of about 458 nm is less than about 480 nm). The first luminescent peak wavelength may be in a range of from about 470 nm to about 440 nm, from about 465 nm to about 445 nm, from about 460 nm to about 450 nm, or a combined range recited herein.

In the method of an embodiment, a mole of the second organic ligand to the first organic ligand may be selected appropriately. In the method of an embodiment, a mole ratio of the second ligand to the first organic ligand may be greater than or equal to about 0.05:1, greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.45:1, greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, greater than or equal to about 0.85:1, or greater than or equal to about 0.9:1. The mole ratio of the second organic ligand to the first organic ligand may be less than or equal to about 20:1, less than or equal to about 15:1, less than or equal to about 10:1, less than or equal to about 9:1, less than or equal to about 8:1, less than or equal to about 7:1, less than or equal to about 6:1, less than or equal to about 5:1, less than or equal to about 4:1, less than or equal to about 3:1, less than or equal to about 2:1, less than or equal to about 1:1, less than or equal to about 0.9:1, less than or equal to about 0.85:1, less than or equal to about 0.8:1, less than or equal to about 0.75:1, less than or equal to about 0.7:1, less than or equal to about 0.65:1, less than or equal to about 0.6:1, less than or equal to about 0.55:1, less than or equal to about 0.5:1, less than or equal to about 0.45:1, less than or equal to about 0.4:1, less than or equal to about 0.35:1, less than or equal to about 0.3:1, or less than or equal to about 0.25:1.

Without wishing to be bound by any theory, the method of an embodiment may effectively suppress the discontinuous (or ununiform, e.g., non-uniform) growth of the second semiconductor nanocrystal and whereby the nanostructures as obtained may exhibit the derivative thermogravimetry curve described herein. The nanocrystals obtained by the method of an embodiment may exhibit a relatively uniform particle size distribution (e.g., a relatively small relative standard deviation) even when they include an increased amount of the second semiconductor nanocrystal, showing, e.g., exhibiting, an improved luminous efficiency together with a reduced full width at half maximum.

The chalcogen precursor(s) may be added into the (heated) reaction system to carry out a reaction. The chalcogen precursor(s) may be added at the same time or sequentially during the reaction time taking into consideration a desired composition of the second semiconductor nanocrystal or the shell to form the second semiconductor nanocrystal (or the shell) (e.g., having a gradient composition or a multi-layered composition).

In an embodiment, the formation of the second semiconductor nanocrystal (or the shell) may include reacting the zinc precursor and the selenium precursor and then reacting the zinc precursor and the sulfur precursor. For example, in an embodiment, a zinc precursor may react with a selenium precursor to form a first shell layer including zinc and selenium and then reacted with a sulfur precursor to form a second shell layer including zinc and sulfur. In an embodiment, a zinc precursor may react with the selenium and the sulfur precursors to form a semiconductor nanocrystal shell including zinc, selenium, and sulfur (e.g., ZnSeS).

In the disclosed method, the zinc precursor may include a Zn powder, ZnO, an alkylated Zn compound (e.g., C2 to C30 alkyl (e.g., dialkyl) zinc such as dimethyl zinc, diethyl zinc), a Zn alkoxide (e.g., a zinc ethoxide), a Zn carboxylate (e.g., a zinc acetate or zinc aliphatic carboxylate, for example, zinc long chain aliphatic carboxylate such as zinc oleate), a Zn nitrate, a Zn perchlorate, a Zn sulfate, a Zn acetylacetonate, a Zn halide (e.g., a zinc chloride), a Zn cyanide, a Zn hydroxide, zinc carbonate, zinc peroxide, or a combination thereof. Examples of the zinc precursor may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The tellurium precursor may include tellurium-trioctylphosphine (Te-TOP), tellurium-tributylphosphine (Te-TBP), tellurium-triphenylphosphine (Te-TPP), tellurium-diphenylphosphine (Te-DPP), or a combination thereof, but is not limited thereto.

The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), sulfur-octadecene (S-ODE), bistrimethylsilyl sulfide, ammonium sulfide, sodium sulfide, or a combination thereof.

In a reaction system for the core formation and a reaction system for the shell formation, an amount of each precursor and a concentration thereof may be selected taking into consideration a desired composition of the core and the shell, a reactivity between the core and shell precursors, or the like. In an embodiment, taking into consideration a desired composition of resulting nanostructures (e.g., a ratio between elements such as Zn, S, Se, Te, or a combination thereof), ratios between the precursors may be controlled.

After the formation of the core, or the nanostructure, a non-solvent is added to the nanocrystal particles coordinated with, e.g., bound to, a ligand compound to facilitate separation or isolation of the core particles or the nanostructures.

The non-solvent may be a polar solvent that is miscible with the solvent used in the core formation reaction, or the nanostructure formation reaction, and is not capable of dispersing the produced nanocrystals. The non-solvent may be selected taking into consideration the solvent used in the reaction, and may be for example acetone, ethanol, butanol, isopropanol, ethanediol, water, tetrahydrofuran (THF), dimethylsulfoxide (DMSO), diethyl ether, formaldehyde, acetaldehyde, a solvent having a similar solubility parameter to the foregoing non-solvents, or a combination thereof. Separation of the nanocrystal particles may involve centrifugation, sedimentation, chromatography, filtration, distillation, or a combination thereof. The separated nanocrystal particles may be added to a washing (or dispersing) solvent and washed (or dispersed), if desired. Types of the washing (dispersing) solvent are not particularly limited and a solvent having similar solubility parameter to that of the ligand may be used and examples thereof may include hexane, heptane, octane, chloroform, toluene, benzene, or the like.

In an embodiment, a composition includes the aforementioned (e.g., a plurality of) nanostructure(s). The composition may further include a (photo)polymerizable monomer having a, e.g., at least one, carbon-carbon double bond, a dispersing agent, a (photo) initiator; or a combination thereof. The composition may further include a liquid vehicle. The liquid vehicle may include an organic solvent, a monomer, or a combination thereof. The dispersing agent may disperse the nanostructures in the composition. The dispersing agent may be a compound (e.g., a monomer or a polymer) including a carboxylic acid group. The composition may be a photosensitive composition.

Details of the nanostructures in the composition are the same as set forth herein. An amount of the quantum dot(s) in the composition (or a composite that will be described herein) may be appropriately adjusted taking into consideration a desirable final use (e.g., a photoluminescent color filter, etc.) and the composition (or the composite). In an embodiment, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a total weight or a total solid content of the composition. The amount of the quantum dot may be less than or equal to about 70 wt %, for example, less than or equal to about 65 wt %, less than or equal to about 60 wt %, less than or equal to about 55 wt %, or less than or equal to about 50 wt %, based on a total weight or a total solid content of the composition. An amount of a given component based on a total solid content of the composition may correspond to an amount of the given component in a composite prepared from the composition.

In a composition according to an embodiment, a dispersing agent may contribute to obtain an appropriate dispersibility of the quantum dots. The dispersing agent may include an organic compound (a monomer or a polymer) including a carboxylic acid group. The binder polymer may be an insulating polymer.

The organic compound including a carboxylic acid group may include a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer having a backbone structure in which two aromatic rings are bound to a quaternary carbon atom that is a constituent atom of another cyclic moiety in the main chain and including a carboxylic acid group (—COOH) (hereinafter, a cardo binder); or a combination thereof.

The dispersing agent may include a first monomer, a second monomer, and optionally a third monomer.

In the composition, an amount of the dispersing agent or the binder (polymer or monomer) may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight or a total solid content of the composition, but is not limited thereto. The amount of the dispersing agent or the binder may be less than or equal to about 55 wt %, less than or equal to about 45 wt %, less than or equal to about 35 wt %, for example less than or equal to about 33 wt %, or less than or equal to about 30 wt %, based on a total weight or a total solid content of the composition. An amount of the dispersing agent (or the binder) may be from about 0.5 wt % to about 55 wt %, based on a total solid content of the composition.

The composition may include a polymerizable (e.g., photopolymerizable) monomer including the carbon-carbon double bond. The monomer may include a (e.g., photopolymerizable) acryl-based monomer, i.e., a monomer containing an acryl group. The polymerizable monomer may be a precursor for an insulating polymer.

An amount of the polymerizable monomer may be greater than or equal to about 0.5 wt %, for example, greater than or equal to about 1 wt % or greater than or equal to about 2 wt %, based on a total weight or a total solid content of the composition. The amount of the photopolymerizable monomer may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %, based on a total weight or a total solid content of the composition.

The composition may include a (photo or thermal)-initiator that can be used for (photo)polymerization of the monomers. The (photo or thermal)-initiator is a compound accelerating a radical reaction (e.g., radical polymerization of monomer) by producing radical chemical species under a mild condition (e.g., by heat or light). As indicated, the initiator may be a thermal initiator or a photoinitiator. Compounds for the initiator are not particularly limited and may be selected appropriately.

In the composition, an amount of the initiator may be appropriately adjusted taking into consideration a type of the polymerizable monomer, an amount of the polymerizable monomer, or a combination thereof. In an embodiment, the initiator may be used in an amount range of about at least 0.01 wt %, at least about 1 wt % and less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight or a total solid content of the composition, but is not limited thereto.

The composition or a composite prepared therefrom may further include a (multi- or mono-functional) thiol compound including a, e.g., at least one (e.g., at least two, three, or four), thiol group(s) (for example, at a terminal end of the (multi- or mono-functional) thiol compound), a metal oxide fine particle, or a combination thereof.

The metal oxide fine particle may include $TiO_2$, $SiO_2$, $BaTiO_3$, $Ba_2TiO_4$, ZnO, or a combination thereof. In the composition, an amount of the metal oxide fine particle may be greater than or equal to about 1 wt %, greater than or equal to about 5 wt %, or greater than or equal to about 10 wt % and less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, or less than or equal to about 5 wt %, based on a total weight (or total solid content) of the composition or the composite. The metal oxide fine particle may be non-light emissive. As used herein, the phrase "metal oxide" may include an oxide of a metal or a metalloid.

A diameter of the metal oxide fine particle is not particularly limited and may be selected appropriately. The diameter of the metal oxide fine particle may be greater than or equal to about 100 nm, for example, greater than or equal to about 150 nm, or greater than or equal to about 200 nm and less than or equal to about 1,000 nm or less than or equal to about 800 nm.

The multi-functional thiol compound may be a dithiol compound, a trithiol compound, tetrathiol compound, or a combination thereof. For example, the thiol compound may be glycol (e.g., ethylene glycol) di-3-mercaptopropionate, glycol (e.g., ethylene glycol) dimercapto acetate, trimethylolpropane tris(3-mercaptopropionate), pentaerythritol tetrakis (3-mercaptopropionate), pentaerythritol tetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the thiol compound, e.g., mono-thiol compound, multi-thiol compound, or a combination thereof, may be less than or equal to about 50 wt %, less than or equal to about 45 wt %, less than or equal to about 40 wt %, less than or equal to about 35 wt %, less than or equal to about 30 wt %, less than or equal to about 25 wt %, less than or equal to about 20 wt %, less than or equal to about 15 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight (or total solid content) of the composition. The amount of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, greater than or equal to about 15 wt %, greater than or equal to about 20 wt %, or greater than or equal to about 25 wt %, based on a total weight (or total solid content) of the composition or the composite.

The composition may further include an organic solvent (or a liquid vehicle, hereinafter referred to as an organic solvent). Non limiting examples of the organic solvent may include ethyl 3-ethoxy propionate; an ethylene glycol such as ethylene glycol, diethylene glycol, or polyethylene glycol; a glycol ether such as ethylene glycol monomethyl ether, ethylene glycol monoethyl ether, diethylene glycol monomethyl ether, ethylene glycol diethylether, or diethylene glycol dimethyl ether; a glycol ether acetate such as ethylene glycol monomethyl ether acetate, ethylene glycol monoethyl ether acetate, diethylene glycol monoethyl ether acetate, or diethylene glycol monobutyl ether acetate; propylene glycol; a propylene glycol ether such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethylether, or dipropylene glycol diethylether; a propylene glycol ether acetate such as propylene glycol monomethyl ether acetate, or dipropylene glycol monoethyl ether acetate; an amide such as N-methylpyrrolidone, dimethyl formamide, or dimethyl acetamide; a ketone such as methylethylketone (MEK), methyl isobutyl ketone (MIBK), or cyclohexanone; a petroleum such as toluene, xylene, or solvent naphtha; an ester such as ethyl acetate, butyl acetate, or ethyl lactate; an ether such as diethyl ether, dipropyl ether, or dibutyl ether; chloroform, a C1 to C40 aliphatic hydrocarbon (e.g., alkane, alkene, or alkyne), a halogen (e.g., chloro) substituted C1 to C40 aliphatic hydrocarbon (e.g., dichloroethane, trichloromethane, or the like), a C6 to C40 aromatic hydrocarbon (e.g., toluene, xylene, or the like), a halogen (e.g., chloro) substituted C6 to C40 aromatic hydrocarbon, or a combination thereof.

A type and an amount of the organic solvent may be appropriately selected by taking into consideration the disclosed main components (i.e., the quantum dot, the dispersing agent, the polymerizable monomer, the initiator, and if used, the thiol compound,) and an additive and an amount of the additive which is described herein. The composition may include an organic solvent in a residual amount except for a desired content of the (non-volatile) solid.

The composition (e.g., an ink jet composition) may have a viscosity at 25° C. of greater than or equal to about 4 centiPoise (cPs), greater than or equal to about 5 cPs, greater than or equal to about 5.5 cPs, greater than or equal to about 6.0 cPs, or greater than or equal to about 7.0 cPs. The composition (e.g., an ink jet composition) may have a viscosity at 25° C. of less than or equal to about 12 cPs, less than or equal to about 10 cPs, or less than or equal to about 9 cPs.

If the composition is applied in an ink jet process, the composition may be discharged onto a substrate at room temperature and may form a quantum dot polymer composite or a pattern of quantum dot polymer composite, for example, by heating. Together with the disclosed viscosity, the ink composition may have a surface tension at 23° C. of greater than or equal to about 21 milliNewtons per meter (mN/m), greater than or equal to about 22 mN/m, greater than or equal to about 23 mN/m, greater than or equal to about 24 mN/m, greater than or equal to about 25 mN/m, greater than or equal to about 26 mN/m, greater than or equal to about 27 mN/m, greater than or equal to about 28 mN/m, greater than or equal to about 29 mN/m, greater than or equal to about 30 mN/m, or greater than or equal to about 31 mN/m and less than or equal to about 40 mN/m, less than or equal to about 39 mN/m, less than or equal to about 38 mN/m, less than or equal to about 36 mN/m, less than or equal to about 35 mN/m, less than or equal to about 34 mN/m, less than or equal to about 33 mN/m, or less than or equal to about 32 mN/m. A surface of the ink composition may be less than or equal to about 31 mN/m, less than or equal to about 30 mN/m, less than or equal to about 29 mN/m, or less than or equal to about 28 mN/m.

The composition may further include various additives for a photoresist composition or an ink jet composition. The additive(s) may include a light diffusing agent, a leveling agent, a coupling agent, or the like, details of which may be found in, for example, US-2017-0052444-A1.

In an embodiment, the composition according to an embodiment may be prepared by a method including preparing a quantum dot dispersion including the quantum dots, a dispersing agent, and a solvent; and mixing the quantum dot dispersion with an initiator; a polymerizable monomer (e.g., acryl-based monomer); optionally, the thiol compound; optionally, the metal oxide particulates, and optionally, the aforementioned additive. Each of the components may be mixed sequentially or simultaneously, but mixing orders are not particularly limited.

The composition of an embodiment may be used for providing a pattern including a nanostructure composite (e.g., a quantum dot-polymer composite). The composition may provide a quantum dot polymer composite via (e.g., radical) polymerization. In an embodiment, the composition may be a photoresist composition that may be applicable to a photolithography process. In an embodiment, the composition may be an ink composition that may be applicable to an ink jet process (e.g., a liquid drop discharging method such as an ink jet printing).

In an embodiment, a nanostructure composite (e.g., nanostructure polymer composite) may include a (polymer) matrix; and the nanostructures dispersed in the matrix. The nanostructure composite may further include a metal oxide fine particle(s) dispersed in the matrix. The (polymer) matrix may include a crosslinked polymer, a linear polymer, or a combination thereof. The cross-linked polymer may include a thiolene polymer, a cross-linked poly(meth)acrylate, a crosslinked polyurethane, a crosslinked epoxy resin, a cross-linked vinyl polymer, a crosslinked silicone resin, or a combination thereof. In an embodiment, the cross-linked polymer may be a polymerization product of the polymerizable monomer and, optionally, the multi-thiol compound. The linear polymer may include a repeating unit derived from a carbon-carbon unsaturated bond (e.g., a carbon-carbon double bond). The repeating unit may include a carboxylic acid group. The linear polymer may include an ethylene repeating unit.

The matrix may include the dispersing agent (e.g., a binder monomer or polymer), a polymerization product (e.g., insulating polymer) of a polymerizable monomer including a carbon-carbon double bond (a, e.g., at least one, for example, at least two, at least three, at least four, or at least five), optionally a polymerization product of the polymerizable monomer and a multi thiol compound including at least two thiol groups (e.g., at a terminal end of the multi thiol compound), or a combination thereof. The nanostructure polymer composite may further include a metal oxide fine particle(s). Details of the metal oxide fine particle are the same as described herein.

The (polymer) matrix may include a crosslinked polymer, a linear polymer, or a combination thereof. The cross-linked polymer may include a thiolene polymer, a cross-linked poly(meth)acrylate, or a combination thereof. In embodiment, the crosslinked polymer may include a polymerization product of the polymerizable monomer and optionally a multi thiol compound. Details of the quantum dots, the dispersing agent, or the binder polymer, the polymerizable monomer, and the multi thiol compound are the same as described herein.

A (patterned) film of the nanostructure-polymer composite may have, for example, a thickness of less than or equal to about 30 micrometers (μm), for example less than or equal to about 25 μm, less than or equal to about 20 μm, less than or equal to about 15 μm, less than or equal to about 10 μm, less than or equal to about 8 μm, or less than or equal to about 7 μm and greater than about 2 μm, for example, greater than or equal to about 3 μm, greater than or equal to about 3.5 μm, greater than or equal to about 4 μm, greater than or equal to about 5 μm, or greater than or equal to about 6 μm.

In an embodiment, a patterned film of the nanostructure-polymer composite may include a, e.g., at least one, repeating section configured to emit light of a predetermined wavelength. In an embodiment, the repeating section may include a first section emitting first light. The repeating section may include a second section emitting second light having a different maximum (photo) luminescent peak wavelength from a maximum (photo) luminescent peak wavelength of the first light. The first section, the second section, or a combination thereof may include the quantum dot composite.

The first light or the second light may be red light having a maximum photoluminescence peak wavelength which is present between about 600 nm and about 650 nm (e.g., about 620 nm to about 650 nm) or green light having a maximum photoluminescence peak wavelength which is present between about 500 nm and about 550 nm (e.g., about 510 nm to about 540 nm). The patterned film may further include a third section emitting or passing third light (e.g., blue light) different from the first light and the second light. The third light may have a maximum (photo) luminescent peak wavelength ranging from 380 nm to 480 nm.

As represented in FIG. 1A, a patterned film of a nanostructure composite may be prepared by using a photoresist composition. In such a method, a composition may be applied to form a film having a predetermined thickness on a substrate in an appropriate method of spin coating, slit coating, and the like (Step 1). The formed film may be, optionally, pre-baked (PRB) (Step 2). The pre-baking may be performed by selecting an appropriate condition (a temperature, time, an atmosphere, and the like). A selected area of the formed (or optionally pre-baked) film is exposed (EXP) to light having a predetermined wavelength (e.g., of less than or equal to about 400 nm) (Step 3). A wavelength and intensity of the light may be selected considering types and amounts of the photoinitiator, types, and amounts of the nanostructures, and the like. The exposed film may be treated with an alkali developing (DEV) solution (e.g., dipping or spraying) to dissolve an unexposed region and obtain a desired pattern (Step 4). The obtained pattern may be, optionally, post-baked (FOB) to improve crack resistance and solvent resistance of the pattern, for example, at about 150° C. to about 230° C. for a predetermined time (e.g., greater than or equal to about 10 minutes or greater than or equal to about 20 minutes) (Step 5).

In an embodiment wherein the nanostructure-polymer composite pattern has a plurality of repeating sections, a nanostructure-polymer composite having a desired pattern may be obtained by using a black matrix (BM) and preparing a plurality of compositions including a nanostructure having desired photoluminescence properties (a photoluminescence peak wavelength and the like) (e.g., a red light emitting quantum dot, a green light emitting quantum dot, or optionally, a blue light emitting quantum dot) to form each repeating section and repeating a formation of the disclosed pattern about, e.g., with, each composition an appropriate number of times (e.g., twice or more or three times or more) (Step 6). For example, the nanostructure-polymer composite may have, e.g., be provided in, a pattern including at least two repeating color sections (e.g., RGB sections). The nanostructure-polymer composite pattern may be used as a photoluminescence-type color filter in a display device.

Figure 1B:
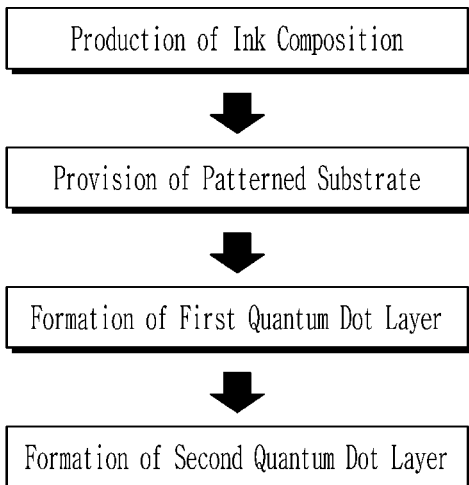
FIG. 1B schematically represents a process of producing a nanostructure composite pattern using an ink composition.

A nanostructure composite pattern may be formed by using an ink composition configured to form a pattern via an ink jet manner. Referring to FIG. 1B, the method includes preparing an ink composition; obtaining a substrate including a pattern of, for example, an electrode and optionally a pixel area formed by a bank; depositing an ink composition on the substrate (or the pixel area) to form a first nanostructure layer (or a first repeating section); and depositing an ink composition on the substrate (or the pixel area) to form a second nanostructure layer (or a second repeating section). Formation of the first nanostructure layer and the second nanostructure layer may be carried out simultaneously or sequentially.

Deposition of the ink composition may be carried out using an appropriate droplet discharging system such as an ink jet printer or a nozzle printing system. The deposited ink composition may be heated to remove a solvent and optionally to carry out a polymerization, and thus, provide a (first or second) nanostructure layer. The method may provide a highly precise nanostructure-polymer composite film or pattern in a relatively simple way in a relatively short period of time.

The nanostructure composite pattern may be utilized as a photoluminescent color filter in a display device. In an embodiment, an electronic device may include the nanostructure(s). The electronic device may include a display device, a light emitting diode (LED), an organic light emitting diode (OLED), a QD LED, a sensor, a solar cell, an imaging sensor, or a liquid crystal display (LCD), but is not limited thereto. The nanostructures may be included in an electronic apparatus. The electronic apparatus may include a handheld terminal, a monitor, a notebook computer, a television, an electronic display board, a camera, an automatic vehicle, but is not limited thereto. The electronic apparatus may be a handheld terminal, a monitor, a notebook computer, or a television each of which includes a display device (or a light emitting device) including a quantum dot. The electronic apparatus may be a camera or a handheld terminal each of which includes an image sensor including a quantum dot. The electronic apparatus may be a camera or an automatic vehicle each of which includes a photodetector including the nanostructures.

In an embodiment, a display device (or light emitting device) may include a light emitting element and optionally a light source. The light emitting element may include a light emission layer. The light emitting element may include a substrate and the light emission layer may be disposed on the substrate. The light emission layer may include a film or a patterned film of a quantum dot composite. A light source may be configured to provide the light emitting element with incident light. The incident light may have a luminescence peak wavelength of greater than or equal to about 440 nm, for example, greater than or equal to about 450 nm and less than or equal to about 560 nm, less than or equal to about 500 nm, less than or equal to about 480 nm, less than or equal to about 470 nm, or less than or equal to about 460 nm.

Figure 2:
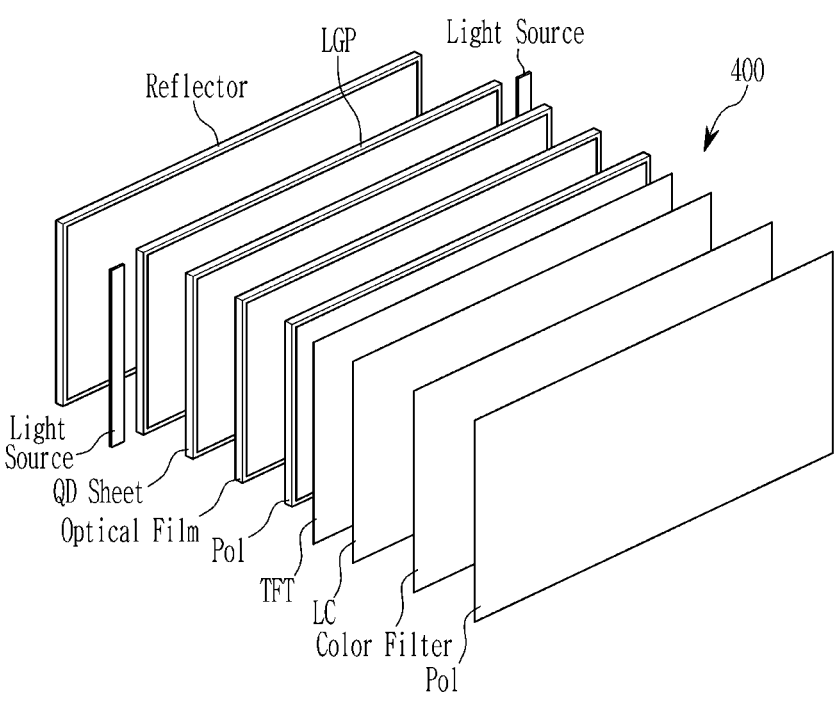
FIG. 2 is an exploded view of a display device according to an embodiment.

In an embodiment, the light emitting element, or the light emission layer, may include a sheet of the quantum dot polymer composite. Referring to FIG. 2, a device 400 of a photoluminescent type may include a backlight unit and a liquid crystal (LC) panel and the backlight unit may include the sheet of the quantum dot polymer composite (QD sheet). The backlight unit may have a structure wherein a reflector, a light guide panel (LGP) and a blue LED light source (Blue-LED), the nanostructure-polymer composite sheet (QD sheet), and various optical films such as a prism, double brightness enhance film (DBEF), and the like are stacked, and a liquid crystal panel is disposed on the backlight unit. Between two polarizers (Pol), a thin film transistor (TFT), a liquid crystal panel, and a color filter may be disposed. The quantum dot polymer composite (QD sheet) may include red quantum dots and green quantum dots that absorbs light from the light source and emits red and green light, respectively. Blue light provided from the light source passes through the quantum dot polymer composite sheet and combined with the red and green lights emitted from the nanostructures is converted into white light. The white light may be separated into a blue light, a green light, and a red light by a color filter in the liquid crystal panel and extracted outside according to the pixel.

In an embodiment, the light emitting layer includes a patterned film of a quantum dot polymer composite, and the patterned film may include a repeating section configured to emit light of a predetermined wavelength. The repeating section may include a first repeating section that may emit a first light. The first section may be a section emitting red light. The repeating section may include a second repeating section that may emit a second light. The second section may be a section emitting green light. The repeating section may include a third repeating section that may emit or transmit a third light. The third section may be a section emitting or transmitting blue light. Further details of the first, second, third section are described herein.

The light source includes an element that emits an excitation light. The excitation light may include blue light and optionally green light. The light source may include an LED. The light source may include an organic LED (e.g., OLED). In an embodiment, on a front side (i.e., light emitting face) of the first section and the second section is disposed a first optical element 160 in FIG. 3A and FIG. 3B and 310 in FIG. 4 cutting (e.g., absorbing or reflecting) blue light and optionally green light. The light source may include a blue light emitting OLED (organic light emitting diode) and a green light emitting OLED, and the third section emitting or transmitting blue light may be disposed on an optical element that filters or removes green light.

The light source may include a plurality of light emitting units respectively corresponding to the first section and the second section, and each of the light emitting units may include a first electrode and a second electrode facing each other and an electroluminescent layer disposed between the first electrode and the second electrode. The electroluminescent layer may include an organic light emitting material. For example, each light emitting unit of the light source may include an electroluminescent device (e.g., an organic light emitting diode (OLED)) configured to emit light of a predetermined wavelength (e.g., blue light, green light, or a combination thereof). Structures and materials of the electroluminescent device such as the organic light emitting diode (OLED) are not particularly limited.

Figure 3A:
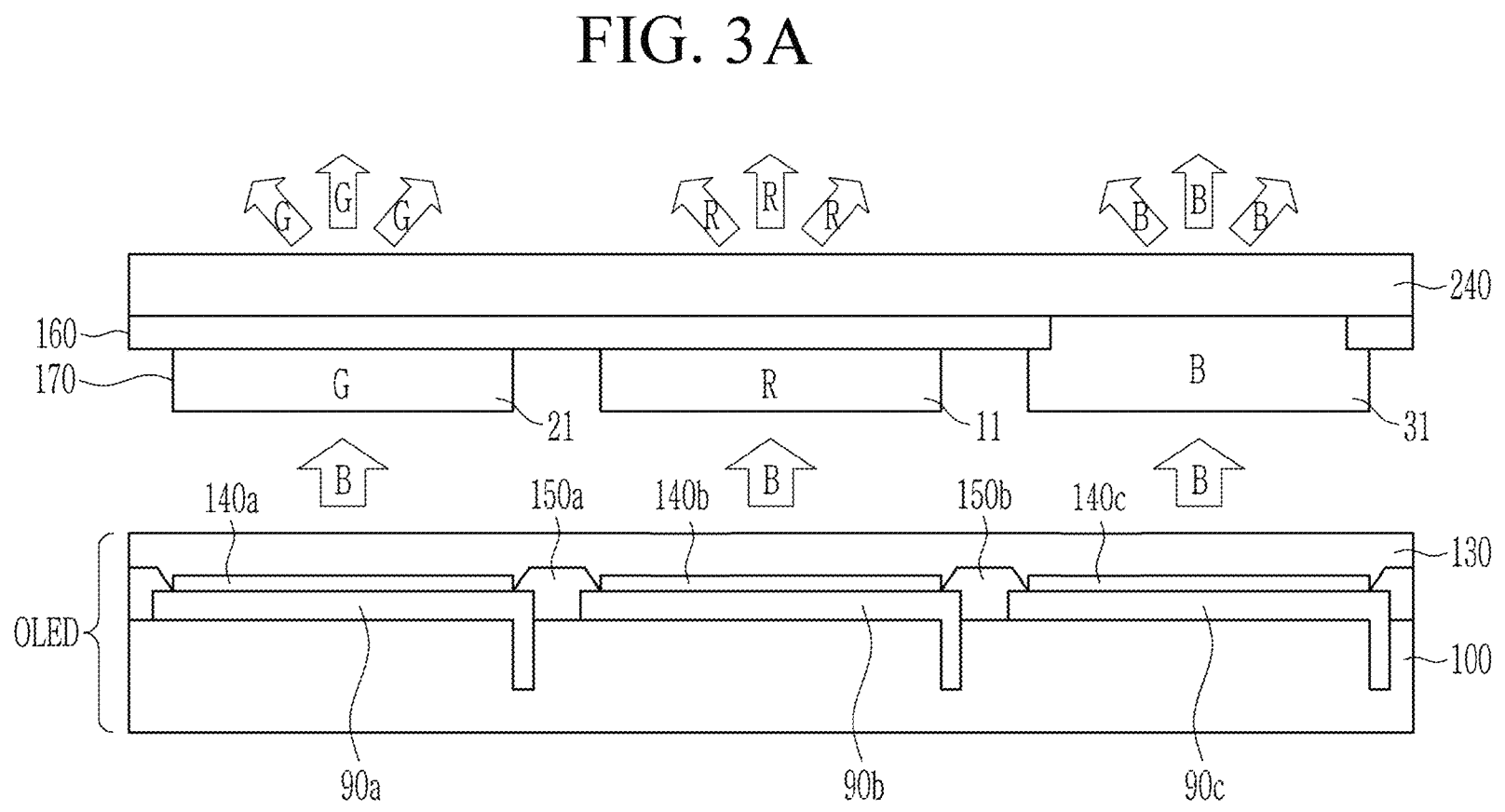
Figure 3B:
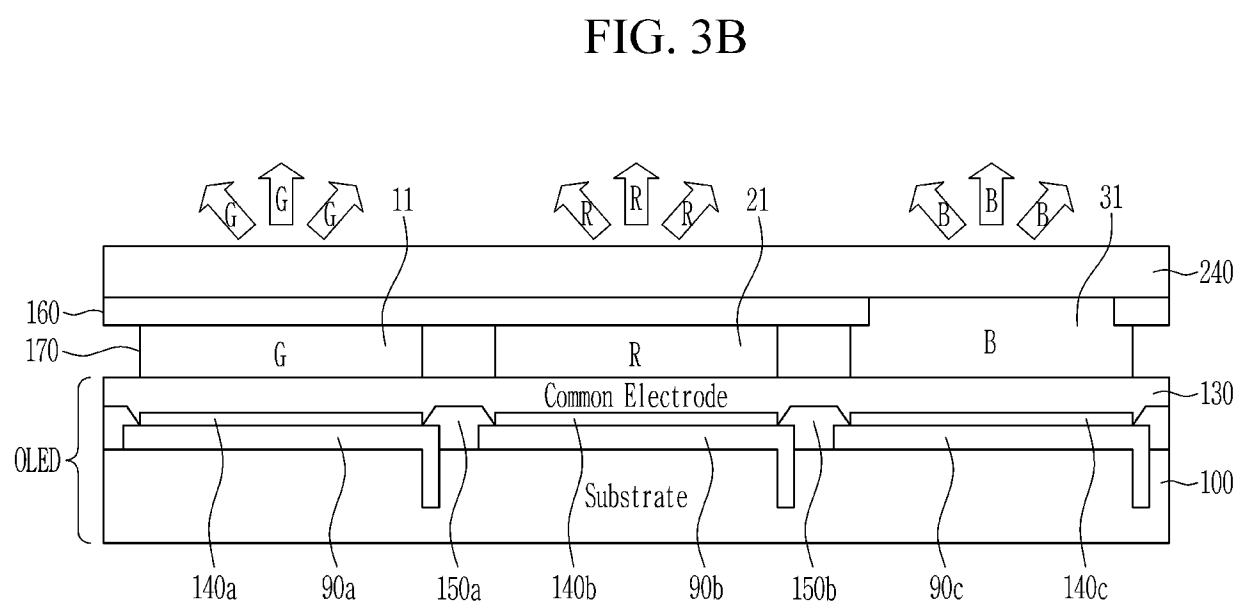
Figure 4:
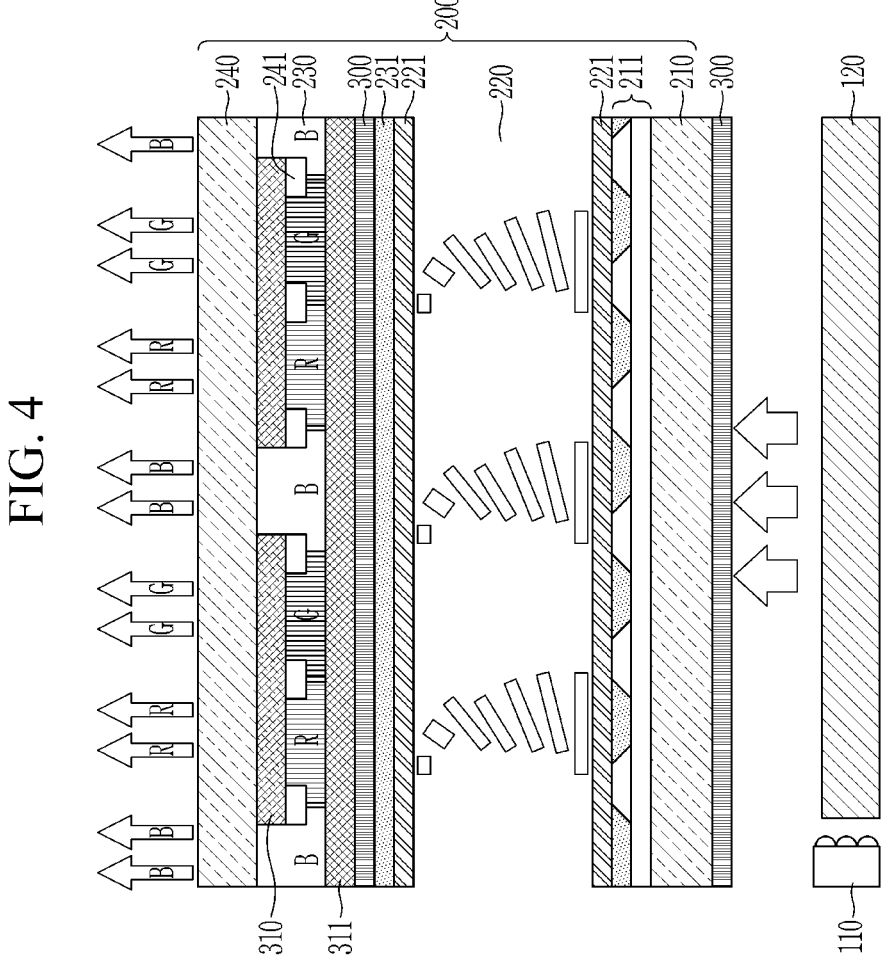
FIG. 4 is a schematic cross-sectional view of a display device according to an embodiment.

FIG. 3A is a schematic cross-sectional view of a display device according to an embodiment, FIG. 3B is a schematic cross-sectional view of a display device according to another embodiment, and FIG. 4 is a schematic cross-sectional view of a display device according to an embodiment. Referring to FIGS. 3A and 3B, a light source may include an organic light emitting diode (OLED) emitting blue light. The organic light emitting diode OLED may include (at least two, for example, three or more) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140*b*, 140*c*. A thin film transistor and a substrate may be disposed under the organic light emitting diode (OLED). The pixel areas of the OLED may be disposed corresponding to the first, second, and third sections that will be described in detail herein, respectively.

A stacked structure including a nanostructure composite pattern 170 (e.g., a section 31 including or not including a quantum dot e.g., emitting blue light, a section 11 including red light emitting quantum dots, and a section 21 including green light emitting quantum dots) and a substrate may be disposed on the light source. The light (e.g., blue light) emitted from the light source may enter the second section 11 and the first section 21 of the pattern 170 to emit (e.g., converted) red light R and green light G, respectively. The blue light B emitted from the light source passes through or transmits from the third section 31. Between the nanostructure composite layer (R, G) and the substrate 240, an optical element 160 in FIG. 3A and FIG. 3B and 310 in FIG. 4 (a first optical filter or an excitation light cut layer) cutting the light from the light source may be disposed, if desired. In an embodiment, the light from the light source may include blue light and green light, a green light cut filter may be disposed over the third section. Details of the first optical filter or the excitation light cut filter may be further described in detail herein.

The display device may be obtained by separately fabricating the stacked structure and (e.g., blue light emitting) LED or OLED and then assembling the same. Alternatively, the display device may be obtained by forming a nanostructure-polymer composite pattern directly on the LED or OLED.

The substrate may be a substrate including an insulating material. The substrate may include glass; various polymers such as a polyester (e.g., polyethylene terephthalate (PET) polyethylene naphthalate (PEN), a polymethacrylate, or a polyacrylate); a polycarbonate; a polysiloxane (e.g., polydimethylsiloxane (PDMS)); an inorganic material such as $Al_2O_3$ or ZnO; or a combination thereof, but is not limited thereto. A thickness of the substrate may be selected appropriately taking into consideration a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dot.

A wire layer including a thin film transistor or the like is formed on the substrate. The wire layer may further include a gate line, a sustain voltage line, a gate insulating layer, a data line, a source electrode, a drain electrode, a semiconductor, a protective layer, and the like. The detailed structure of the wire layer may be verified according to an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described herein.

The pixel electrode may function as an anode of the display device. The pixel electrode may be formed of a transparent conductive material such as indium tin oxide (ITO) or indium zinc oxide (IZO). The pixel electrode may be formed of a material having a light-blocking property such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure in which the transparent conductive material and the material having light-blocking properties are stacked sequentially.

Between two adjacent pixel electrodes, a pixel define layer (PDL) may overlap with a terminal end of the pixel electrode to divide the pixel electrode into a pixel unit. The pixel define layer is an insulation layer which may electrically block the at least two pixel electrodes.

The pixel define layer covers a part of the upper surface of the pixel electrode, and the remaining region of the pixel electrode not covered by the pixel define layer may provide an opening. An organic emission layer that will be described herein may be formed on the region defined by the opening.

The organic emission layer defines each pixel area by the pixel electrode and the pixel define layer. In other words, one pixel area may be defined as an area formed with one organic emission unit layer which is contacted with one pixel electrode divided by the pixel define layer. For example, in the display device according to an embodiment, the organic emission layer may be defined as a first pixel area, a second pixel area and a third pixel area, and each pixel area may be spaced apart from each other leaving a predetermined interval by the pixel define layer.

In an embodiment, the organic emission layer may emit a third light belong to a visible light region or belong to an ultraviolet (UV) region. That is, each of the first to the third pixel areas of the organic emission layer may emit a third light. In an embodiment, the third light may be a light having a higher energy in the visible light region, for example, may be blue light, and optionally green light. When all pixel areas of the organic emission layer are designed to emit the same light, each pixel area of the organic emission layer may be all formed of the same or similar materials or may exhibit the same or similar properties. A process difficulty of forming the organic emission layer may be decreased, and the display device may be applied for, e.g., formed by or used in, a large scale/large area process. However, the organic emission layer according to an embodiment is not necessarily limited thereto, but the organic emission layer may be designed to emit at least two different lights, e.g., lights of at least two different colors.

The organic emission layer includes an organic emission unit layer in each pixel area, and each organic emission unit layer may further include an auxiliary layer (e.g., hole injection layer (HIL), hole transport layer (HTL), electron transport layer (ETL), etc.) besides the emission layer.

The common electrode may function as a cathode of the display device. The common electrode may be formed of a transparent conductive material such as indium tin oxide (ITO) or indium zinc oxide (IZO). The common electrode may be formed on the organic emission layer and may be integrated therewith.

A planarization layer or a passivation layer may be formed on the common electrode. The planarization layer may include a (e.g., transparent) insulating material for ensuring electrical insulation with the common electrode.

In an embodiment, the display device may further include a lower substrate, a polarizer disposed under the lower substrate, and a liquid crystal layer disposed between the stack structure and the lower substrate, and in the stack structure, the light emission layer may be disposed to face the liquid crystal layer. The display device may further include a polarizer between the liquid crystal layer and the emission layer. The light source may further include LED and if desired, a light guide panel.

Non-limiting examples of the display device (e.g., a liquid crystal display device) according to an embodiment are illustrated with a reference to a drawing. FIG. 3 is a schematic cross sectional view showing a liquid crystal display device according to an embodiment. The display device of an embodiment includes a liquid crystal panel 200, a polarizer 300 disposed under the liquid crystal panel 200, and a backlight unit (110, 120) disposed under the polarizer 300.

The liquid crystal panel 200 includes a lower substrate 210, a stack structure, and a liquid crystal layer 220 disposed between the stack structure and the lower substrate. The stack structure includes a transparent substrate 240 and a photoluminescent layer 230 including a pattern including a quantum dot polymer composite.

The lower substrate 210 also referred to be an array substrate may be a transparent insulating material substrate. The substrate is the same as described herein. A wire plate 211 is provided on an upper surface of the lower substrate 210. The wire plate 211 may include a plurality of gate wires and data wires that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 220 may be disposed on the wire plate 211. The liquid crystal panel 200 may include an alignment layer 221 on or under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are not particularly limited.

A lower polarizer 300 is provided under the lower substrate 210. Materials and structures of the polarizer 300 are not particularly limited. A backlight unit (e.g., emitting blue light) may be disposed under the polarizer 300. An upper optical element or an upper polarizer 300 may be provided between the liquid crystal layer 220 and the transparent substrate 240, but is not limited thereto. For example, the upper polarizer 300 may be disposed between the liquid crystal layer 220 and the photoluminescent (e.g., light emission) layer 230. The polarizer may be any suitable polarizer that may be used in a liquid crystal display device. The polarizer may be TAC (triacetyl cellulose) having a thickness of less than or equal to about 200 μm, but is not limited thereto. In an embodiment, the upper optical element may be a coating that controls a refractive index without a polarization function.

The backlight unit includes a light source 110. The light source may emit blue light (shown) or white light. The light source may include a blue (or green) LED, a (white) LED, a (white) OLED, or a combination thereof, but is not limited thereto.

The backlight unit may further include a light guide panel 120. In an embodiment, the backlight unit may be an edge-type lighting. For example, the backlight unit may include a reflector, a light guide panel provided on the reflector and providing a planar light source with the liquid crystal panel 200, a, e.g., at least one, optical sheet on the light guide panel, for example, a diffusion plate, a prism sheet, and the like, or a combination thereof, but is not limited thereto. The backlight unit may not include a light guide panel. In an embodiment, the backlight unit may be a direct lighting. For example, the backlight unit may have a reflector, and may have a plurality of fluorescent lamps disposed on the reflector at regular intervals, or may have an LED operating substrate on which a plurality of light emitting diodes may be disposed, a diffusion plate thereon, and optionally a, e.g., at least one, optical sheet. Details (e.g., each component of a light emitting diode, a fluorescent lamp, light guide panel, various optical sheets, and a reflector) of such a backlight unit are not particularly limited.

A black matrix 241 is provided under the transparent substrate 240 and has openings and hides a gate line, a data line, and a thin film transistor of the wire plate on the lower substrate. For example, the black matrix 241 may have a lattice shape. The photoluminescent layer 230 is provided in the openings of the black matrix 241 and has a nanostructure-polymer composite pattern including a first section (R) configured to emit a first light (e.g., red light), a second section (G) configured to emit a second light (e.g., green light), and a third section (B) configured to emit/transmit, for example blue light. If desired, the photoluminescent layer may further include a, e.g., at least one, fourth section. The fourth section may include a quantum dot that emits light of different color from light emitted from the first to third sections (e.g., cyan, magenta, and yellow light).

In the light emission layer 230, sections forming a pattern may be repeated corresponding to pixel areas formed on the lower substrate. A transparent common electrode 231 may be provided on the photoluminescent layer 230 (e.g., photoluminescent color filter layer).

The third section (B) configured to emit/transmit blue light may be a transparent color filter that does not change a light emitting spectrum of the light source. Blue light emitted from the backlight unit may enter in a polarized state and may be emitted through the polarizer and the liquid crystal layer. If desired, the third section may include a quantum dot emitting blue light.

As explained herein, if desired, the display device or the light emitting device may further include an excitation light blocking layer or a first optical filter layer (hereinafter, referred to as a first optical filter layer). The first optical filter layer may be disposed between bottom surfaces of the first section (R) and the second section (G) and a substrate (e.g., the upper substrate 240) or on a top surface of a substrate (e.g., the upper substrate 240). The first optical filter layer may include a sheet having openings that correspond to a pixel area showing a blue color (e.g., third section). In other words, the first optical filter layer may be integrally formed as one body structure at the portions except portions overlapped with the third section, but is not limited thereto. At least two (e.g., three) first optical filter layers may be spaced apart and be disposed on each of the positions overlapped with the first and the second sections and optionally the third section. When the light source includes a green light emitting element, a green light cut filter layer may be disposed on the third section.

In an embodiment, the first optical filter layer may block light having a portion of a wavelength region in the visible light region. The first optical filter layer may transmit light having other (visible light) wavelength regions. For example, the first optical filter layer may block blue light (or green light) and transmit light except blue (or green) light. For example, the first optical filter layer may transmit green light, red light, or yellow light that is mixed light thereof. The first optical filter layer may transmit blue light and block the green light and may be disposed on the blue light emitting pixel.

In an embodiment, the first optical filter layer may substantially block excitation light and may transmit light of desired wavelength. In an embodiment, the first optical filter layer may have light transmittance of greater than or equal to about 70%, greater than or equal to about 80%, greater than or equal to about 90%, or about 100% with respect to a light of a desired wavelength range.

In an embodiment, a first optical filter layer selectively transmitting red light may be disposed on the portion overlapped with the section emitting red light and the first optical filter layer selectively transmitting green light may be disposed on the portion overlapped with the section emitting green light, respectively. In an embodiment, the first optical filter layer may include a first region, a second region, or a combination thereof, wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). In an embodiment, the excitation light may include blue light and green light, and a first optical filter layer may further include a third region that blocks the green light and selectively transmit blue light.

The first region may be disposed at a place overlapped with the section emitting green light. The second region may be disposed at a place overlapped with the section emitting red light. The third region may be disposed at a place overlapped with the section emitting or transmitting blue light.

The first region, the second region, and optionally the third region may be optically isolated. The first optical filter layer may contribute to improving color purity of a display device.

The display device may further include a second optical filter layer 311 (e.g., red/green light or yellow light recycling layer) that is disposed between the light emitting layer 230 and the liquid crystal layer 220, and between the light emitting layer 230—(e.g., the quantum dot polymer composite layer) and the upper polarizer 300. The second optical filter layer 311 may transmit at least a portion of a third light (i.e., excitation light), and reflect at least a portion of a first light, a second light, or a first light and a second light. The first light may be red light. The second light may be green light. The third light may include blue light. The second optical filter layer may transmit the third light (B) of a blue light wavelength range having a wavelength of less than or equal to about 500 nm. Light of a wavelength range of greater than about 500 nm (e.g., red light R, green light G, or yellow light) may not be allowed to pass the second optical filter and may be reflected thereby. The reflected green light and red light is then transmitted through the first and second sections and is emitted out of the display device.

In the display device according to an embodiment, the first optical filter layer, the second optical filter layer, or the first optical filter layer and the second optical filter layer may be formed as an integrated single layer having an approximately planar surface.

In an embodiment, the first optical filter layer may include a dye, pigment, or a combination thereof absorbing light of a predetermined wavelength to be blocked. The first optical filter layer, the second optical filter layer, or the first optical filter layer and the second optical filter layer may include a monolayer having a low refractive index, for example, and the monolayer having a low refractive index may be a transparent thin film having a refractive index of less than or equal to about 1.4, less than or equal to about 1.3, or less than or equal to about 1.2. The first or second optical filter layer having a low refractive index may be, for example, a porous silicon oxide, a porous organic material, a porous organic/inorganic composite, or a combination thereof.

In an embodiment, the second (or first) optical filter layer may include a plurality of layers having different refractive indexes, for example, the second (or first) optical filter layer may be formed by alternately stacking two layers having different refractive indexes, or for example, the second or first optical filter layer may be formed by alternately stacking a material having a high refractive index and a material having a low refractive index.

Figure 5A:
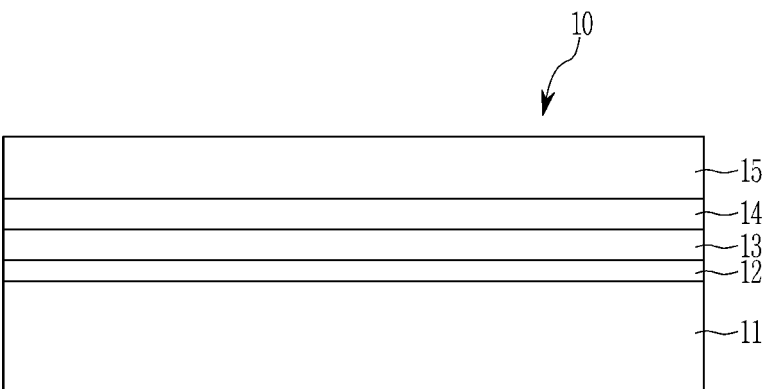
FIG. 5A is a schematic cross-sectional view of a light emitting device according to an embodiment.

Referring to FIG. 5A, the electronic device 10 may include a first electrode 11 and a second electrode 15 each having a surface opposite the other and an active layer 13 disposed between the first and the second electrodes and including the aforementioned quantum dot composite. The first electrode 11 or the second electrode 15 may be an anode and the other may be a cathode. In particular, the first electrode 11 is an anode and the second electrode 15 is a cathode as discussed further herein.

In an embodiment, the electronic device may be an electroluminescent device. The active layer 13 may be a light emissive layer that includes the nanostructures, where an electron and a hole injected from cathode 15 and anode 11, respectively, are recombined to form an exciton and according to the energy of the formed exciton, light having a predetermined wavelength is emitted. In an embodiment, the electronic device including the quantum dot may be a photodetector or a solar cell. The active layer 13 may be a light absorptive layer and the nanostructure of the active layer 13 may absorb a photon from outside, which will then be separated into a hole and an electron and provide the same with the anode 11 and the cathode 15, respectively.

In an embodiment, the electronic device may include a hole auxiliary layer 12 between the first electrode (anode) 11 and the active layer 13, an electron auxiliary layer 14 between the second electrode (cathode) 15 and the active layer 13, or a combination thereof.

The light emitting device may further include a substrate (not shown). The substrate may be disposed at the side of the anode 11 or the cathode 15, or at the sides of both electrodes. In an embodiment, the substrate may be disposed at an opposite surface of the first electrode (anode). The substrate may include an insulating material (e.g., insulating transparent substrate).

The substrate may include glass; a polymer such as a polyester (e.g., polyethylene terephthalate (PET), polyethylene naphthalate (PEN)), a polycarbonate, a polyacrylate, a polyimide, a poly(amide-imide), a polysiloxane (e.g., PDMS), or a combination thereof; an inorganic material such as $Al_2O_3$, ZnO, or a combination thereof; or a combination including at least two of the foregoing, but is not limited thereto. The substrate may be made of a silicon wafer. As used herein, the term "transparent" refers to having a transmittance of greater than or equal to about 85% of light having a predetermined wavelength (e.g., light emitted from a quantum dot), or for example, transmittance of greater than or equal to about 88%, greater than or equal to about 90%, greater than or equal to about 95%, greater than or equal to about 97%, or greater than or equal to about 99%, e.g., about 85% to about 99.99%, or about 90% to about 99.9%. A thickness of the substrate may be appropriately selected considering a substrate material but is not particularly limited. The transparent substrate may be flexible.

The first electrode 11 may be made of an electrically conductive material, for example a metal, a conductive metal oxide, or a combination thereof. The first electrode 11 may include, for example, a metal or an alloy thereof, the metal including nickel, platinum, vanadium, chromium, copper, zinc, and gold; a conductive metal oxide such as zinc oxide, indium oxide, tin oxide, indium tin oxide (ITO), indium zinc oxide (IZO), or fluorine doped tin oxide; or a combination of metal and a metal oxide such as ZnO and Al or $SnO_2$ and Sb, but is not limited thereto.

The second electrode 15 may be made of a conductive material, for example a metal, a conductive metal oxide, a conductive polymer, or a combination thereof. The second electrode 15 may include, for example, a metal or an alloy thereof, such as aluminum, magnesium, calcium, sodium, potassium, titanium, indium, yttrium, lithium, gadolinium, silver, gold, platinum, tin, lead, cesium, or barium; a multi-layer structured material such as LiF/Al, $Li_2O$/Al, 8-hydroxyquinolinolato-lithium/aluminum (Liq/Al), LiF/Ca, or $BaF_2$/Ca, but is not limited thereto. A combination including at least two of the foregoing may also be used. The conductive metal oxide is the same as described herein.

In an embodiment, a work function of the first electrode 11 and a work function of the second electrode 15 are not particularly limited and selected appropriately. A work function of the first electrode may be higher than or lower than a work function of the second electrode.

The first electrode 11, the second electrode 15, or a combination thereof may be a light-transmitting electrode and the light-transmitting electrode may be for example made of a conductive oxide such as a zinc oxide, an indium oxide, a tin oxide, an indium tin oxide (ITO), an indium zinc oxide (IZO), a fluorine doped tin oxide, a metal thin layer including a single layer or a multilayer, or a combination thereof. The first electrode 11, the second electrode 15, or a combination thereof may be a non-light-transmitting (e.g., non-transparent) electrode, which may include, for example, an opaque conductive material such as aluminum (Al), silver (Ag), gold (Au), or a combination thereof.

A thickness of the electrodes (the first electrode, the second electrode, or each of the first electrode and the second electrode) is not particularly limited and may be appropriately selected with consideration of the device efficiency. For example, the thickness of the electrodes may be greater than or equal to about 5 nanometers (nm), for example, greater than or equal to about 50 nm, or greater than or equal to about 1 μm. For example, the thickness of the electrodes may be less than or equal to about 100 micrometers (μm), for example, less than or equal to about 10 μm, less than or equal to about 1 μm, less than or equal to about 900 nm, less than or equal to about 500 nm, or less than or equal to about 100 nm.

The active layer 13 includes (e.g., a plurality of) the aforementioned nanostructure(s). The active layer may include a, e.g., at least one, monolayer of the quantum dots. The active layer 13 may include a, e.g., at least one, monolayer (e.g., at least two monolayers, at least three monolayers, at least four monolayers) of the quantum dot. The number of the monolayers of the nanostructures may be less than or equal to about 20, less than or equal to about 10, less than or equal to about 9, less than or equal to about 8, less than or equal to about 7, or less than or equal to about 6.

The active layer 13 may have a thickness of greater than or equal to about 5 nm, for example, greater than or equal to about 10 nm, greater than or equal to about 20 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The active layer 13 may have for example a thickness of about 10 nm to about 150 nm, for example about 20 nm to about 100 nm or about 30 nm to about 50 nm.

The light emitting device of an embodiment may further include a hole auxiliary layer 12. In a non-limiting embodiment, the hole auxiliary layer 12 may be disposed between the first electrode 11 and the active layer 13. The hole auxiliary layer 12 may have one layer or two or more layers, and may include, for example, a hole injection layer (HIL), a hole transport layer (HTL), an electron blocking layer, or a combination thereof. The hole auxiliary layer 12 may include a single component layer or a multi-layered structure wherein adjacent layers include different components from each other.

The hole auxiliary layer 12 may have a highest occupied molecular orbital (HOMO) energy level that may match a HOMO energy level of the active layer 13 in order to facilitate mobility of holes from the hole auxiliary layer 12 into the active layer 13. In an embodiment, the hole auxiliary layer 12 may include a hole injection layer proximate to the first electrode 11 and a hole transport layer proximate to the active layer 13.

A material included in the hole auxiliary layer 12 (for example, a hole transporting layer or a hole injection layer) is not particularly limited and may include, for example, poly(9,9-dioctyl-fluorene-co-N-(4-butylphenyl)-diphenylamine) (TFB), polyarylamine, poly(N-vinylcarbazole), poly(3,4-ethylenedioxythiophene) (PEDOT), poly(3,4-ethylenedioxythiophene):polystyrene sulfonate (PEDOT:PSS), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA (4,4',4"-tris[phenyl (m-tolyl)amino]triphenylamine), 4,4',4"-tris(N-carbazolyl)-triphenylamine (TCTA), 1,1-bis[(di-4-tolylamino) phenyl]cyclohexane (TAPC), a p-type metal oxide (e.g., NiO, $WO_3$, $MoO_3$, etc.), a carbon-based material such as graphene oxide, or a combination thereof, but is not limited thereto.

If used, the electron blocking layer (EBL) may include, for example, poly(3,4-ethylenedioxythiophene):poly(styrene sulfonate) (PEDOT:PSS), poly(9,9-dioctyl-fluorene-co-N-(4-butylphenyl)-diphenylamine) (TFB), polyarylamine, poly(N-vinylcarbazole), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

In the hole auxiliary layer(s), a thickness of each layer may be appropriately selected depending on the desired characteristics of each layer. For example, the thickness of each layer may be greater than or equal to about 5 nm, greater than or equal to about 10 nm, greater than or equal to about 15 nm, greater than or equal to about 20 nm and less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm, but is not limited thereto.

In an embodiment, the electron auxiliary layer 14 may be disposed between the active layer 13 and the second electrode 15. The electron auxiliary layer 14 may include, for example, an electron injection layer (EIL) facilitating the injection of the electrons, an electron transport layer (ETL) facilitating the transport of the electrons, a hole blocking layer (HBL) blocking the hole movement, or a combination thereof, but is not limited thereto.

In an embodiment, the EIL may be disposed between the ETL and the cathode. In an embodiment, the HBL may be disposed between the ETL (or the EIL) and the emissive layer, but is not limited thereto. In an embodiment, a thickness of each layer may be selected appropriately and may be greater than or equal to about 1 nm and less than or equal to about 500 nm, but is not limited thereto. The EIL may be an organic layer (e.g., prepared by vapor deposition). The ETL may include an inorganic oxide nanoparticle, an organic layer (e.g., prepared by vapor deposition), or a combination thereof.

The electron transport layer (ETL), the electron injection layer, or a combination thereof may include, for example, 1,4,5,8-naphthalene-tetracarboxylic dianhydride (NTCDA), bathocuproine (BCP), tris[3-(3-pyridyl)-mesityl]borane (3TPYMB), LiF, tris(8-hydroxyquinoline)aluminum (Alq$_3$), tris(8-hydroxyquinoline)gallium (Gaq$_3$), tris-(8-hydroxy-quinoline)indium (Inq$_3$), bis(8-hydroxyquinoline)zinc (Znq$_2$), bis(2-(2-hydroxyphenyl)benzothiazolate)zinc (Zn (BTZ)$_2$), bis(10-hydroxybenzo[h]quinolinato)beryllium (BeBq$_2$), ET204 (8-(4-(4,6-di(naphthalen-2-yl)-1,3,5-tri-azin-2-yl)phenyl)quinolone), 8-hydroxyquinolinato lithium (Liq), an n-type metal oxide (e.g., ZnO, HfO$_2$, etc.), or a combination thereof, but is not limited thereto.

In an embodiment, the electron auxiliary layer 14 may include an electron transport layer. The ETL may include a plurality of nanoparticles. The nanoparticles include a metal oxide including zinc. The metal oxide may include zinc oxide, zinc magnesium oxide, or a combination thereof. The metal oxide may include $Zn_{1-x}M_xO$ (wherein M is Mg, Ca, Zr, W, Li, Ti, Y, Al, or a combination thereof and $0 \leq x \leq 0.5$). In an embodiment, the M may be magnesium (Mg). In an embodiment, x may be greater than or equal to about 0.01 and less than or equal to about 0.3, for example, less than or equal to about 0.25, less than or equal to about 0.2, or less than or equal to about 0.15. An absolute value of a lowest unoccupied molecular orbital (LUMO) energy level of quantum dots included in the emission layer may be smaller than an absolute value of a LUMO energy level of the metal oxide. In an embodiment, an absolute value of a LUMO energy level of quantum dots may be larger than an absolute value of a LUMO energy level of a metal oxide of ETL. An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm.

The hole blocking layer (HBL) may include, for example, 1,4,5,8-naphthalene-tetracarboxylic dianhydride (NTCDA), bathocuproine (BCP), tris[3-(3-pyridyl)-mesityl]borane (3TPYMB), LiF, Alq$_3$, Gaq$_3$, Inq$_3$, Znq$_2$, Zn(BTZ)$_2$, BeBq$_2$, or a combination thereof, but is not limited thereto.

In an embodiment, the thickness of the electron auxiliary layer 14 (e.g., the thickness of each of an electron injection layer, an electron transport layer, or a hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

Figure 5B:
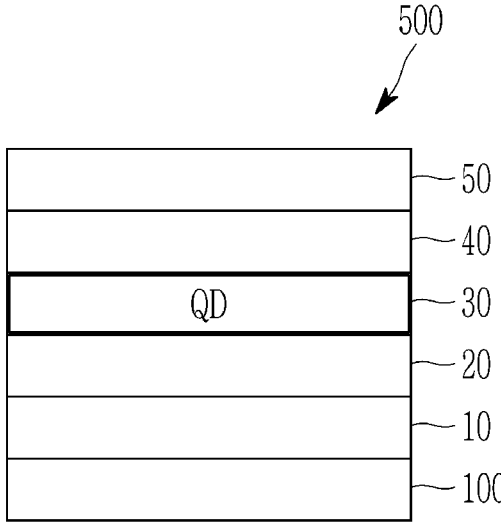
FIG. 5B is a schematic cross-sectional view of a light emitting device according to an embodiment.

Referring to FIG. 5B, an electroluminescent device of an embodiment may have a normal structure. The electroluminescent device 500 may include a transparent substrate 100, an anode 10 disposed on the transparent substrate 100 and a cathode 50 facing the anode 10. The anode 10 may include a metal oxide-based transparent electrode and a cathode 50 facing the anode may include a metal of a relatively low work function. For example, the anode may be an electrode including indium tin oxide (ITO, a work function of about 4.6 electronvolts (eV) and about 5.1 eV) and the cathode may be an electrode including magnesium (Mg, a work function of about 3.66 eV), aluminum (Al, a work function of about 4.28 eV) or a combination thereof. In an embodiment, a hole auxiliary layer 20 may be disposed between the anode 10 and the quantum dot active layer 30. The hole auxiliary layer 20 may include a hole transporting layer, a hole injecting layer, or a combination thereof. If present, the hole injecting layer may be disposed proximate to the anode 10 and the hole transporting layer may be disposed proximate to the quantum dot active layer. In an embodiment, an electron auxiliary layer 40 may be disposed between the quantum dot active layer 30 and the cathode 50. The electron auxiliary layer 40 may include an electron injection layer, an electron transporting layer, or a combination thereof. The electron injection layer may be disposed proximate to the cathode 50 and the electron transporting layer may be disposed proximate to the quantum dot active layer 30.

Figure 5C:
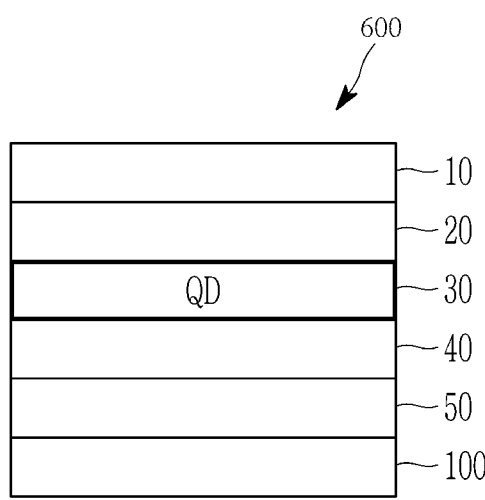
FIG. 5C is a schematic cross-sectional view of a light emitting device according to an embodiment.

Referring to FIG. 5C, a device according to an embodiment may have an inverted structure. An electroluminescent device 600 having the inverted structure may include a cathode 50 disposed on a transparent substrate 100 and an anode 10 facing the cathode. The cathode 50 may include a metal oxide-based transparent electrode (e.g., ITO) and the anode facing the same may include a metal of a relatively high work function. In an embodiment, the anode 50 may be an electrode including indium tin oxide (ITO, a work function of about 4.6 eV and about 5.1 eV) and the cathode may be an electrode including gold (Au, a work function of about 5.1 eV), silver (Ag, a work function of about 4.26 eV), aluminum (Al, a work function of about 4.28 eV), or a combination thereof.

In an embodiment, an electron auxiliary layer 40 may be disposed between the cathode 50 and the quantum dot active layer 30. The electron auxiliary layer 40 may include an electron transporting layer, an electron injecting layer, or a combination thereof. If present, the electron injecting layer may be disposed proximate to the cathode 50 and the electron transporting layer may be disposed proximate to the quantum dot active layer 30. In an embodiment, an electron auxiliary layer 40 may be disposed between the quantum dot active layer 30 and the cathode 50. The electron auxiliary layer 40 (e.g., the electron transporting layer) may include a metal oxide such as a crystalline Zn oxide or n-type doped metal oxide. A hole auxiliary layer 20 may be disposed between the anode 10 and the quantum dot active layer 30. The hole auxiliary layer 20 may include a hole transporting layer, a hole injecting layer, or a combination thereof. If present, the hole injecting layer may be disposed proximate to the anode 10 and the hole transporting layer may be disposed proximate to the quantum dot active layer. The hole transport layer (HTL) may include TFB, PVK, or a combination thereof, and the hole injection layer (HIL) may include $MoO_3$ or another p-type metal oxide, or a combination thereof.

In an embodiment, the electroluminescent device may emit light of a predetermined wavelength generated in the active layer 30 through a transparent electrode and a transparent substrate. For example, referring to FIG. 5B, the anode 10 include a transparent electrode based on indium tin oxide (ITO), the light generated in the active layer may pass the anode 10 and the transparent substrate 100 and emit out of the device. Referring to FIG. 5C, the cathode 50 include a transparent electrode based on indium tin oxide (ITO), the light generated in the active layer may pass the cathode 50 and the transparent substrate 100 and emit out of the device.

The device of the embodiment may be prepared in an appropriate manner. In an embodiment, the electroluminescent device may be prepared by forming a charge (e.g., hole or electron) auxiliary layer on a substrate having an electrode thereon, forming an active layer including the nanostructures (e.g., a pattern of the aforementioned quantum dots) thereon, and forming an electrode (optionally together with a charge (e.g., electron or hole) auxiliary layer) thereon. The formation of the electrode/hole auxiliary layer/electron auxiliary layer is not particularly limited and the electrode, the hole auxiliary layer, and the electron auxiliary layer may be each independently formed in an appropriate manner (e.g., via a physical or chemical deposition or a coating).

Hereinafter, the embodiments are illustrated in more detail with reference to examples. However, they are exemplary examples of the present disclosure, and the present disclosure is not limited thereto.

EXAMPLES

Analysis Method
1. Photoluminescence Analysis
A photoluminescence (PL) spectrum of the produced nanocrystals are obtained using a Hitachi F-7000 spectrophotometer at an irradiation wavelength of 372 nanometers (nm).
2. Ultraviolet (UV) Spectroscopy Analysis
UV spectroscopy analysis is performed using an Agilent Cary 5000 spectrophotometer.
3. Inductively Coupled Plasma (ICP) Analysis
An inductively coupled plasma-atomic emission spectroscopy (ICP-AES) analysis is performed using Shimadzu ICPS-8100.
4. Thermogravimetry Analysis (TGA)
A TGA is performed using TGA Q5000 V3.17 Build 265.
5. Transmission Electron Microscopy (TEM) Analysis A TEM analysis is conducted using UT F30 Tecnai electron microscope. Image J is used to obtain the size related information and the shape factor for the obtained nanostructures.
6. Gas Chromatography (GC) Analysis
A GC-Mass Spectrometry (MS) analysis is conducted using 7000 GC-QQQ.
Synthesis is performed under an inert gas atmosphere (or nitrogen flowing condition) unless particularly stated otherwise.

Example 1

1. Formation of First Semiconductor
Selenium and tellurium are dispersed in trioctylphosphine (TOP) to obtain a 0.4 molar (moles per liter (M)) Se/TOP stock solution and a 0.5 M Te/TOP stock solution. A mixed solution including the Te/TOP stock solution, an organic ligand including oleyl amine, and lithium aluminum hydride is prepared.

In a 300 milliliters (mL) reaction flask, 0.9 millimoles (mmol) of zinc acetate is dissolved in octadecene and oleic acid is added. The reaction mixture (flask) is heated under vacuum at 120° C. After one hour at 120° C., the atmosphere in the flask is replaced with an inert gas (nitrogen), and the reaction flask is heated to 200° C. To the heated reaction flask, the Se/TOP stock solution and the mixed solution are injected to carry out a reaction for forming the first semiconductor nanocrystals for a predetermined time.

The reaction medium is cooled to room temperature and acetone is added to facilitate the forming of a precipitate, which is then separated via centrifugation to provide treated ZnSeTe semiconductor nanocrystal. The obtained ZnSeTe semiconductor nanocrystals are then dispersed in toluene. A first absorption peak of a UV-Vis absorption spectrum of the obtained ZnSeTe semiconductor nanocrystal is about 410 nm.
2. Formation of the Second Semiconductor Nanocrystal
Sulfur is dispersed in trioctylphosphine (TOP) to obtain a 1 molar (M) S/TOP stock solution.

The trioctylamine (TOA) is placed in a 300 mL reaction flask, to which zinc acetate and oleic acid are added, and the flask is heated under vacuum at 120° C. for 30 minutes. The atmosphere in the flask is replaced with an inert atmosphere, and the flask is heated again to a temperature to about 280° C. for pre-treating the mixture for about 20 minutes, whereby a reaction medium including a zinc precursor is obtained.

The reaction medium is once cooled to a temperature of about 150° C. or higher, and then a temperature of the reaction medium is raised to a shell formation temperature (for example, about 240° C.), during which the prepared ZnSeTe semiconductor nanocrystals are added and then at the shell formation temperature, the Se/TOP stock solution and oleyl amine are added, and the reaction proceeds to form a ZnSe semiconductor nanocrystal on the first semiconductor nanocrystal. Then, a temperature of the reaction medium is raised to about 280° C. and the S/TOP stock solution and an additional Zn precursor are added thereto to form a ZnS semiconductor nanocrystal layer.

After the completion of the reaction, the flask is cooled to room temperature and acetone is added to facilitate formation of a precipitate, and the ZnTeSe/ZnSe/ZnS nanostructures are separated via centrifugation. The separated nanostructures are dispersed in toluene.

3. The amounts of the precursors used are controlled to obtain the composition of Table 1. An amount of the oleyl amine is about 1 mmol per 10 mL of the reaction solvent.

4. Analysis

Figure 6A:
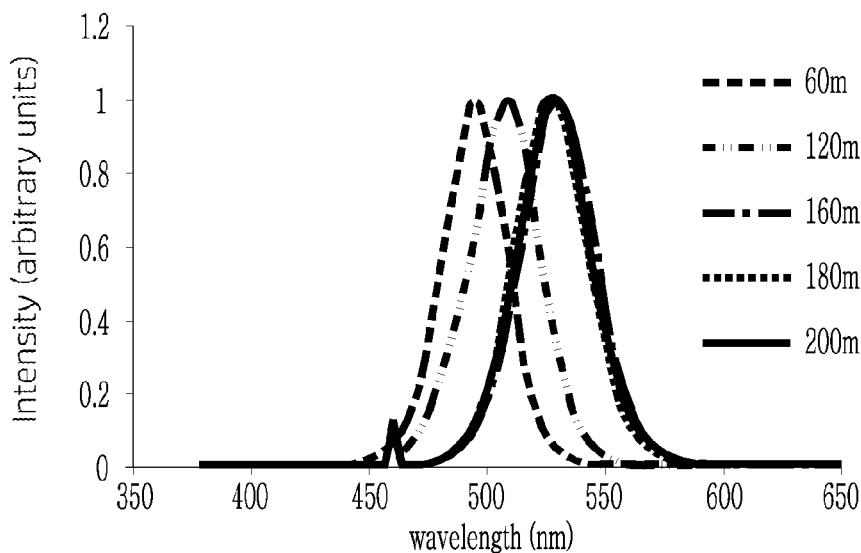
FIG. 6A is a graph of Intensity (arbitrary units) versus wavelength (nm) showing changes of photoluminescent peaks of the nanoparticles included in the reaction system during the formation of the second semiconductor nanocrystal in Example 1.
Figure 6B:
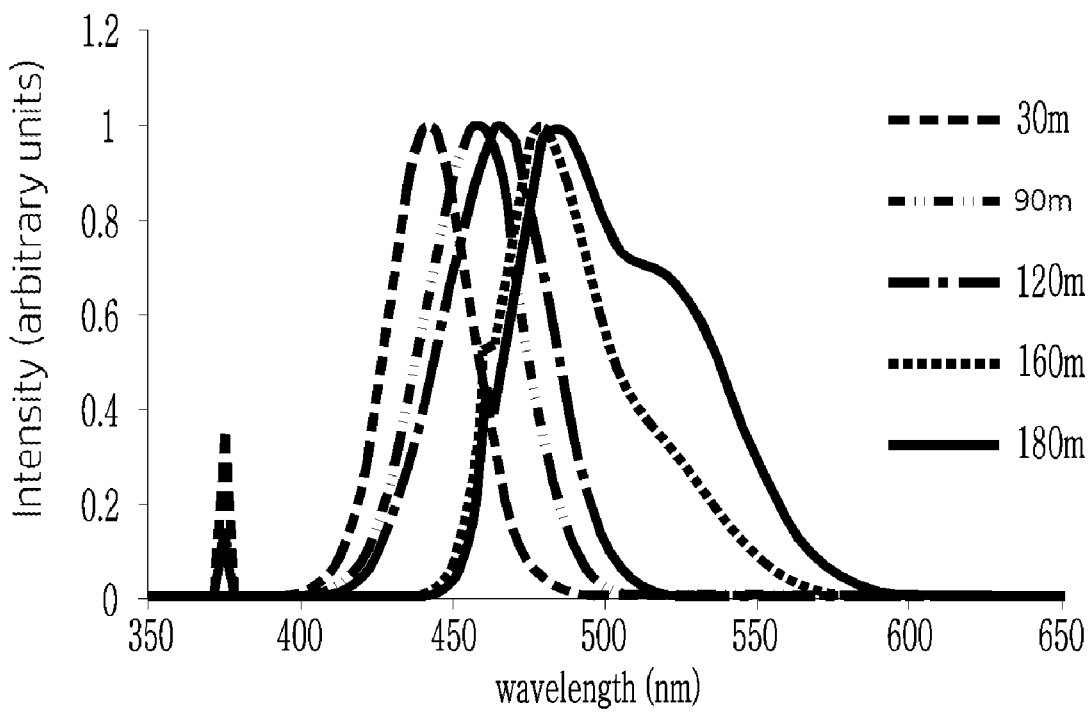
FIG. 6B is a graph of Intensity (arbitrary units) versus wavelength (nm) showing changes of photoluminescent peaks of the nanoparticles included in the reaction system during the formation of the second semiconductor nanocrystal in Comparative Example 1.
Figure 6C:
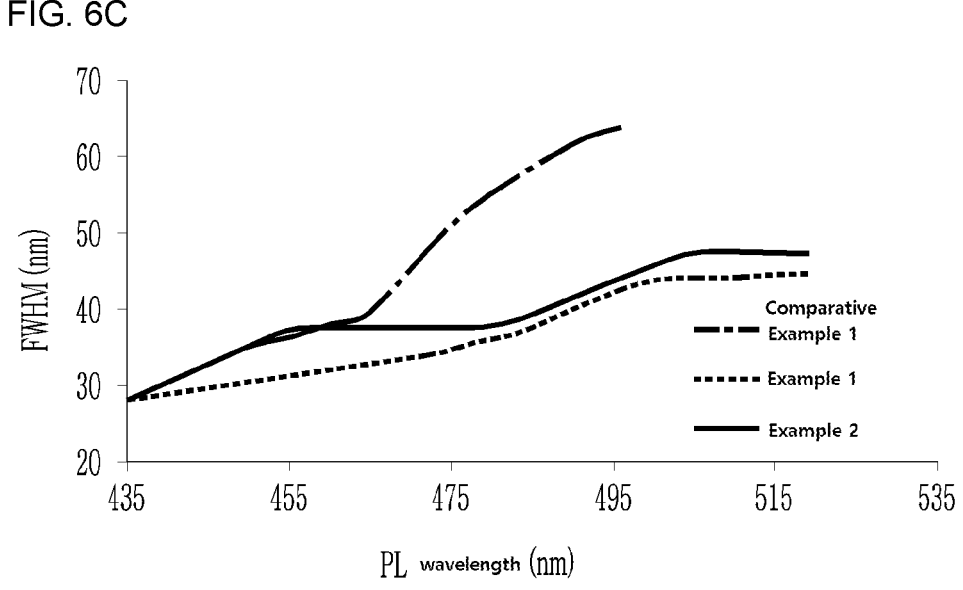
FIG. 6C is a graph of FWHM (nm) versus photoluminescence (PL) wavelength (nm) showing changes of full width at half maximum of the luminescent peaks emitted by the nanoparticles included in the reaction system during the formation of the second semiconductor nanocrystal in Comparative Example 1, Example 1, and Example 2.

During and after the formation the nanostructures, a photoluminescent spectroscopy analysis and a TEM analysis are conducted and the results are shown in FIG. 6A (reaction time: 60 minutes, 120 minutes, 160 minutes, 180 minutes, and 200 minutes) and FIG. 6C and Table 1. For the nanostructures as synthesized, an ICP analysis is conducted and the results are shown in Table 2.

Figure 7A:
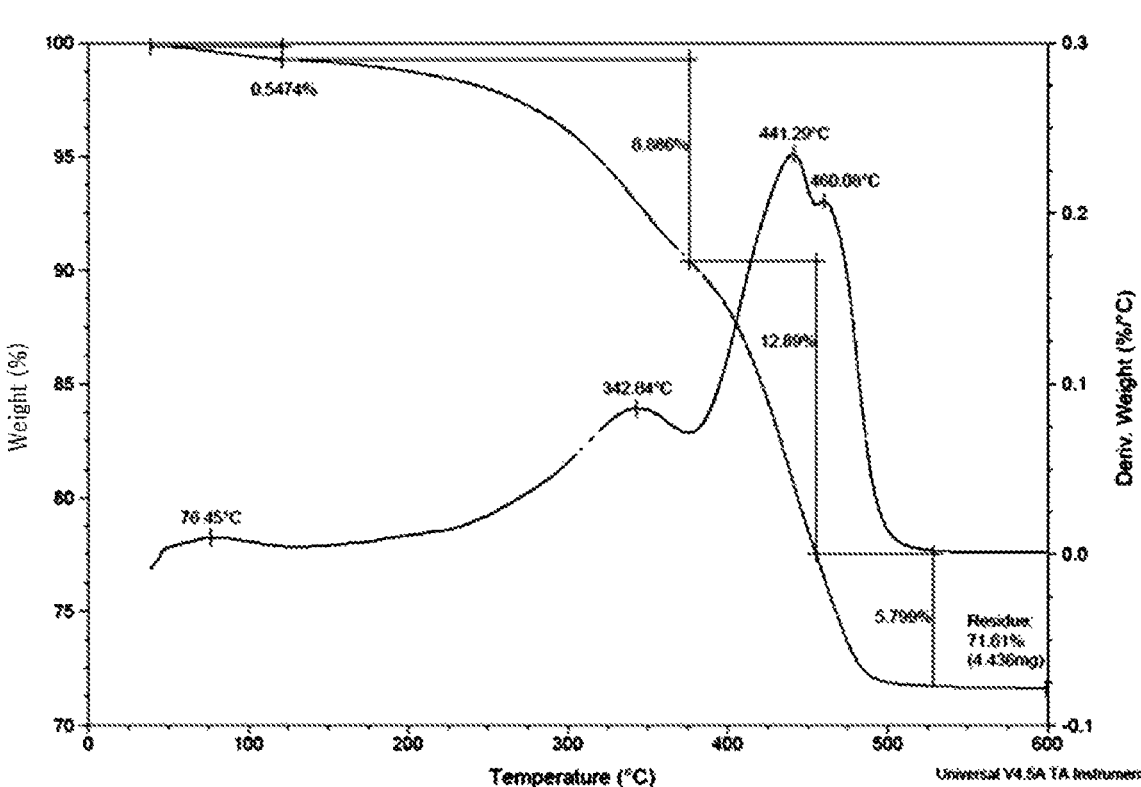
FIG. 7A is a graph of weight (percent (%)) versus temperature (° C.) and a graph of Deriv. weight versus temperature (° C.), each obtained by a thermogravimetric analysis of the nanostructures synthesized in Example 1.

A thermogravimetry analysis is carried out for the nanostructures and the results are shown in FIG. 7A.

Figure 8A:
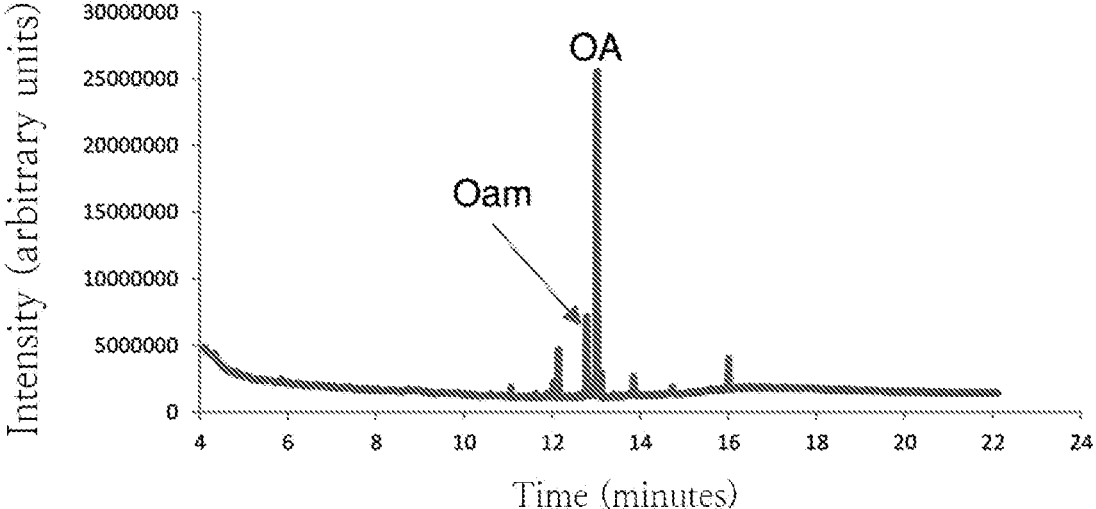
FIG. 8A is a graph of Intensity (arbitrary units) versus Time (minutes) illustrating the results of a gas chromatography analysis of the nanostructures synthesized in Example 1.

For the nanostructures, a GC analysis is conducted and the results are shown in FIG. 8A. The results of FIG. 8A confirm that the GC analysis of the nanostructures as synthesized show, e.g., include, an oleyl amine (Oam) peak and an oleic acid (OA) peak.

Comparative Example 1

The nanostructures of ZnSeTe/ZnSe/ZnS are prepared in the same manner of Example 1 except that the oleyl amine is not used during the formation of the second semiconductor nanocrystal (or the shell).

During the formation of the second semiconductor nanocrystal (reaction time: 30 minutes, 90 minutes, 120 minutes, 160 minutes, and 180 minutes), an aliquot including the particles formed is sampled from the reaction medium to conduct a photoluminescent spectroscopy analysis and the results are shown in FIG. 6B.

During and after the formation the nanostructures, a photoluminescent spectroscopy analysis and a TEM analysis are conducted and the results are shown in FIG. 6B and FIG. 6C and Table 1. For the nanostructures as synthesized, an ICP analysis is conducted and the results are shown in Table 2.

Figure 7B:
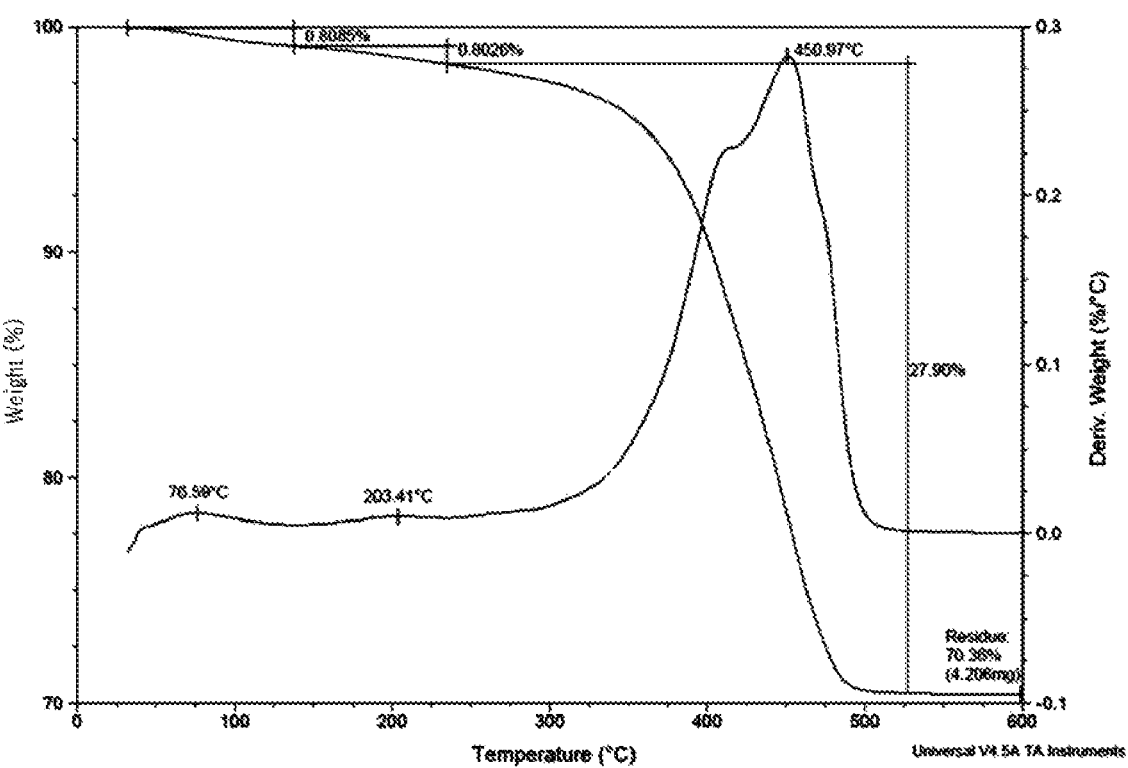
FIG. 7B is a graph of weight (percent (%)) versus temperature (° C.) and a graph of Deriv. weight versus temperature (° C.), each obtained by a thermogravimetric analysis of the nanostructures synthesized in Comparative Example 1.

A thermogravimetry analysis is carried out for the nanostructures and the results are shown in FIG. 7B.

Figure 8B:
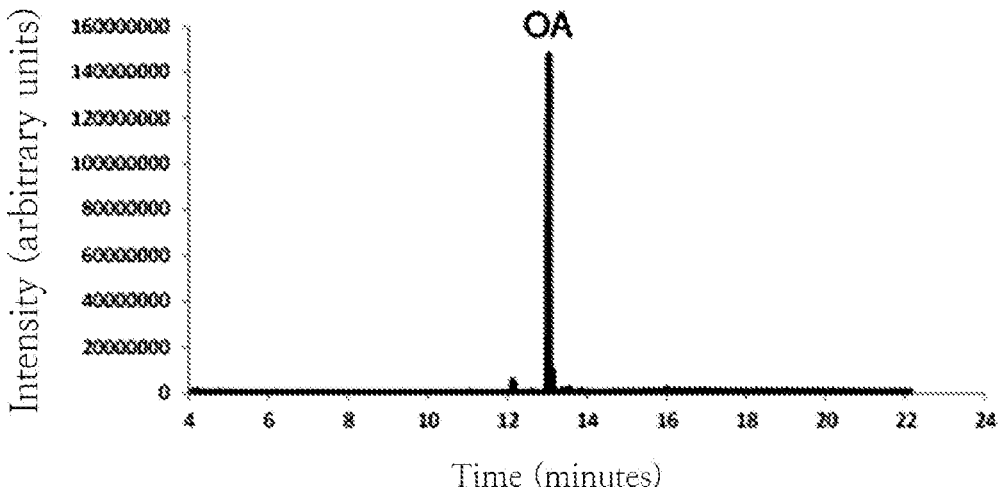
FIG. 8B is a graph of Intensity (arbitrary units) versus Time (minutes) obtained by a gas chromatography analysis of the nanostructures synthesized in Comparative Example 1.

For the nanostructures, a GC analysis is conducted and the results are shown in FIG. 8B. The results of FIG. 8B confirm that the GC analysis of the nanostructures as synthesized show, e.g., include, an oleic acid peak but fail to show, e.g., include, an oleyl amine peak.

Comparative Example 2

The nanostructures of ZnSeTe/ZnSe/ZnS are prepared in the same manner of Example 1 except that the oleyl amine is used during the pre-treating for the preparation of the zinc precursor.

A photoluminescent spectroscopy analysis is conducted and the results confirm that substantially no improvement in the optical properties is observed. A thermogravimetry analysis is carried out and the results confirm that the derivative thermogravimetry curve does not have an extreme value at a temperature below about 400° C.

Example 2

The nanostructures of ZnSeTe/ZnSe/ZnS are prepared in the same manner of Example 1 except that the oleyl amine is added after the addition of the selenium precursor and when the particles in the reaction medium are configured to exhibit a photoluminescent peak wavelength of about 455 nm.

During the formation of the second semiconductor nanocrystal, an aliquot including the particles formed is sampled from the reaction medium to conduct a photoluminescent spectroscopy analysis and the results are shown in FIG. 6C.

A thermogravimetry analysis is carried out for the nanostructures and the results confirm that like the nanostructures prepared in Example 1, the nanostructures thus obtained exhibit a, e.g., at least one, extreme value at a temperature of less than or equal to about 420 nm (e.g., on or below a temperature of about 400° C.).

Comparative Example 3

The nanostructures of ZnSeTe/ZnSe/ZnS are prepared in the same manner of Example 1 except that the oleyl amine is added after the addition of the selenium precursor and when a photoluminescent peak wavelength of the particles in the reaction medium is 480 nm.

A photoluminescent spectroscopy analysis is conducted and the results confirm that the photoluminescent peak of the nanostructures has a full width at half maximum (FWHM) far wider than the nanostructures of Example 1.

Example 3-1 and Example 3-2

The nanostructures are prepared in the same manner of Example 1 except that the shell formation temperature is about 300° C. for Example 3-1 and about 320° C. for Example 3-2, respectively.

A photoluminescent spectroscopy analysis and a TEM analysis are conducted and the results are shown in Table 1. For the nanostructures as synthesized, an ICP analysis is conducted and the results are shown in Table 2.

A thermogravimetry analysis is carried out for the nanostructures and the results confirm that the nanostructures exhibit substantially the same derivative thermogravimetry curve as the nanostructures of Example 1.

TABLE 1

| | PL peak wavelength (nm) | FWHM (nm) | PL quantum yield (QY) (%) | Average particle size (nm) | Relative standard deviation (%) |
|---|---|---|---|---|---|
| Example 1 | 530 | 36 | 94 | 5.7 | 8% |
| Comp. Example 1 | 484 | 70 | 60 | 5 | 14% |
| Example 3-1 | 532 | 38 | 90 | 6 | 8% |
| Example 3-2 | 535 | 40 | 80 | 6.43 | 6% |

The results of Table 1 and FIG. 6A and FIG. 6C suggest that the nanostructures of the Examples can exhibit improved optical properties in comparison with the nanostructures of the comparative examples. In addition, the nanostructures of the Examples can show, e.g., exhibit, a relatively uniform particle size distribution, e.g., relatively small relative standard deviation, even with increased sizes. In addition, the nanostructures of Example 1 exhibit a roundness of about 0.85 (with a relative standard deviation of about 9%) and a solidity of about 0.91 (with a relative standard deviation of about 2%), and thus have very uniform shapes.

From the examples and the comparative examples, the present inventors have found that during the preparation of the nanostructures of Comparative Example 1, a relatively uniform coating can be achieved before the particles present in the reaction medium are configured to show, e.g., exhibit, a luminescent peak wavelength of 480 nm, however, after the luminescent peak wavelength of about 480 nm, some particles can grow to show, e.g., exhibit, a luminescent peak wavelength of about 510 nm while other particles fail to grow and the luminescent peak wavelength of the particles that failed to grow kept, e.g., remained, at about 480 nm (see FIG. 6B). In contrast, according to a method wherein the amine compound is added to the reaction medium as in Example 1, ununiform, e.g., non-uniform, shell growth is not observed and the shell growth uniformly proceeds until the particles can show, e.g., exhibit, a desired luminescent peak wavelength (see FIG. 6A), and the particles may exhibit relatively uniform sizes as shown in Table 1 and may have an improved quantum yield and a narrower FWHM.

The results of FIG. 6C confirms that the nanoparticles prepared in Example 1 and Example 2 to add the oleyl amine at a relatively initial stage or during the forming of the second semiconductor nanocrystal can achieve a relatively narrow FWHM. Without wishing to be bound by any theory, it is believed that in Example 1, the wavelength shift proceeds relatively quickly and a uniform shell growth occurs, and the FWHM of the luminescent peak of the nanoparticles can be maintained narrowly, e.g., maintained in a relatively narrow range. It is also believed that in Example 2, prior to the occurrence of ununiform, e.g., non-uniform, coating, the amine compound is added to the reaction medium of the second semiconductor nanocrystal so that the photoluminescent peak wavelength is shifted in a similar manner to Example 1 and the rate of increase of the FWHM can be controlled and kept slow, e.g., maintained.

Referring to Table 1, in case of Examples 3-1 and 3-2, the reaction temperature is raised and the particles' shapes and size distribution can become more uniform. Without wishing to be bound by any theory, at a higher reaction temperature, the coating amount of the second semiconductor nanocrystal increases and thus the final particle sizes may become greater and a size deviation may become smaller to obtain a uniform particle size distribution.

Referring to FIG. 7A, the derivative thermogravimetry curve of the nanostructures of Example 1 can exhibit a local maximum at a temperature of about 340° C. (a first temperature) and a local minimum at a temperature greater than the first temperature by 25° C., e.g., at a temperature of about 365° C., thus the nanostructures of Example 1 may exhibit two extreme values in a temperature range of less than or equal to about 420° C. The nanostructures of Example 1 may show, e.g., exhibit, a 5% weight loss temperature at about 320° C. In the TGA analysis, the nanostructures of Example 1 may show, e.g., exhibit, a first organic peak, e.g., extreme value, at a temperature of about 340° C. and an additional organic peak, e.g., extreme value, at a temperature range of from about 440° C. to about 460° C. Referring to FIG. 7B, the derivative thermogravimetry curve of the nanostructures of Comparative Example 2 does not exhibit any extreme values below a temperature of about 420° C. and the nanostructures of Comparative Example 2 exhibits an organic peak, e.g., extreme value, at about 450° C. The nanostructures of Comparative Example 1 have a 5% weight loss temperature of greater than 370° C.

TABLE 2

| | ICP (a mole ratio to Te) | | |
| | Zn:Te | Se:Te | (S + Se):Te |
| --- | --- | --- | --- |
| Example 1 | 6.96:1 | 3.17:1 | 4.09:1 |
| Comp. Example 1 | 6.94:1 | 3.65:1 | 4.72:1 |

TABLE 2-continued

| | ICP (a mole ratio to Te) | | |
| | Zn:Te | Se:Te | (S + Se):Te |
| --- | --- | --- | --- |
| Example 2 | 8.96:1 | 2.84:1 | 3.21:1 |
| Example 3-1 | 8.35:1 | 3.28:1 | 5.14:1 |
| Example 3-2 | 11.27:1 | 3.21:1 | 6.96:1 |

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. Core-shell quantum dots comprising
   a first semiconductor nanocrystal comprising zinc and selenium, and
   a second semiconductor nanocrystal comprising a zinc chalcogenide,
   wherein a composition of the second semiconductor nanocrystal is different from a composition of the first semiconductor nanocrystal,
   wherein the core-shell quantum dots further comprise tellurium,
   wherein in the core-shell quantum dots, a mole ratio of selenium to tellurium is greater than or equal to about 0.83:1 and less than or equal to about 10:1,
   wherein a derivative thermogravimetry curve of the core-shell quantum dots has an extreme value in a temperature range of greater than or equal to about 250° C. and less than or equal to about 420° C.

2. The core-shell quantum dots of claim 1, wherein the core-shell quantum dots are configured to emit green light.

3. The core-shell quantum dots of claim 1, wherein the core-shell quantum dots are configured to exhibit a quantum efficiency of greater than or equal to about 60% and less than or equal to about 100%, or
   wherein the core-shell quantum dots are configured to emit light having a luminescent peak with a full width at half maximum of greater than or equal to about 15 nanometers and less than or equal to about 40 nanometers.

4. The core-shell quantum dots of claim 1, wherein the first semiconductor nanocrystal comprises $ZnSe_{1-x}Te_x$, wherein x is greater than or equal to about 0.5 and less than about 1.

5. The core-shell quantum dots of claim 1, wherein the zinc chalcogenide comprises a zinc selenide, a zinc sulfide, a zinc selenide sulfide, or a combination thereof.

6. The core-shell quantum dots of claim 1, wherein a relative standard deviation of sizes of the core-shell quantum dots is greater than or equal to about 1% and less than or equal to about 10%.

7. The core-shell quantum dots of claim 1, wherein an average size of the core-shell quantum dots is greater than or equal to about 4.5 nanometers and less than or equal to about 30 nanometers.

8. The core-shell quantum dots of claim 1, wherein the core-shell quantum dots comprise a total amount of organics of greater than or equal to about 1 weight percent and less than or equal to about 30 weight percent, as determined by a thermogravimetric analysis of the core-shell quantum dots.

9. The core-shell quantum dots of claim 1, wherein a derivative thermogravimetry curve of the core-shell quantum dots has a first local maximum point and a first local minimum in a temperature range of greater than or equal to about 250° C. and less than or equal to about 400° C.

10. The core-shell quantum dots of claim 1, wherein in a thermogravimetric analysis of the core-shell quantum dots, a temperature at 5% weight loss is greater than or equal to about 200° C. and less than or equal to about 370° C.

11. The core-shell quantum dots of claim 1, wherein a mole ratio of selenium to tellurium is greater than or equal to about 2:1 and less than or equal to about 4:1.

12. The core-shell quantum dots of claim 1, wherein the second semiconductor nanocrystal further comprises sulfur and in the core-shell quantum dots, a mole ratio of a total of sulfur and selenium to tellurium is greater than or equal to about 2:1.

13. The core-shell quantum dots of claim 1, the core-shell quantum dots do not comprise indium phosphide.

14. The core-shell quantum dots of claim 1, wherein in the core-shell quantum dots, a mole ratio of zinc to tellurium is greater than or equal to about 3.5:1 and less than or equal to about 40:1.

15. A method of manufacturing nanostructures, which comprises:

preparing an organic solution comprising a zinc precursor in an organic solvent;

optionally heating the organic solution;

adding a first semiconductor nanocrystal comprising zinc and, selenium, and tellurium, and a chalcogen precursor to the organic solution and conducting a reaction between the zinc precursor and the chalcogen precursor to form a second semiconductor nanocrystal comprising a zinc chalcogenide on the first semiconductor nanocrystal to manufacture the nanostructures, wherein the method comprises adding a first compound represented by Chemical Formula 1 to a reaction system for forming the second semiconductor nanocrystal before a luminescent peak wavelength of light emitted from particles in the reaction system reaches about 480 nanometers:

$$R^2NH_2 \qquad\qquad \text{Chemical Formula 1}$$

wherein $R^2$ is a substituted or unsubstituted $C_{5-40}$ hydrocarbon group, wherein the nanostructures comprise tellurium in the first semiconductor nanocrystal, wherein in the nanostructures, a mole ratio of selenium to tellurium is greater than or equal to about 0.83:1 and less than or equal to about 10:1, and wherein a derivative thermogravimetry curve of the nanostructures has an extreme value in a temperature range of greater than or equal to about 250° C. and less than or equal to about 420° C.

16. The method of claim 15, wherein the organic solvent comprises an amine solvent and the amine solvent is different from the first compound.

17. The method of claim 16, wherein the first compound is added to the reaction system after addition of the first semiconductor nanocrystal and optionally before, at a same time, or after addition of the chalcogen precursor.

18. A core-shell quantum dots composite comprising a matrix and the core-shell quantum dots of claim 1, dispersed in the matrix.

19. A display device comprising a light emitting element, wherein the light emitting element comprises the core-shell quantum dots of claim 1.

20. An electronic device comprising:

a first electrode and a second electrode each having a surface opposite the other, and an active layer disposed between the first electrode and the second electrode, the active layer comprising the core-shell quantum dots of claim 1.

* * * * *